ина (IL); Amos

(12) United States Patent
Lahav et al.

(10) Patent No.: US 9,729,810 B2
(45) Date of Patent: Aug. 8, 2017

(54) IMAGE SENSOR PIXEL WITH MEMORY NODE HAVING BURIED CHANNEL AND DIODE PORTIONS

(71) Applicant: Tower Semiconductor Ltd., Migdal Haemek (IL)

(72) Inventors: Assaf Lahav, Binyamina (IL); Amos Fenigstein, Haifa (IL); Yakov Roizin, Afula (IL); Avi Strum, Haifa (IL)

(73) Assignee: Tower Semiconductor Ltd., Migdal Haemek, IL (US)

( * ) Notice: Subject to any disclaimer, the term of this patent is extended or adjusted under 35 U.S.C. 154(b) by 160 days.

(21) Appl. No.: 14/665,803

(22) Filed: Mar. 23, 2015

(65) Prior Publication Data

US 2016/0286151 A1    Sep. 29, 2016

(51) Int. Cl.
  *H04N 5/335* (2011.01)
  *H04N 5/3745* (2011.01)
  *H04N 5/376* (2011.01)
  *H01L 27/146* (2006.01)

(52) U.S. Cl.
  CPC ..... *H04N 5/37452* (2013.01); *H01L 27/1461* (2013.01); *H01L 27/14609* (2013.01); *H01L 27/14614* (2013.01); *H01L 27/14623* (2013.01); *H01L 27/14643* (2013.01); *H04N 5/3765* (2013.01)

(58) Field of Classification Search
  CPC .................................................. H04N 5/37452
  See application file for complete search history.

(56) References Cited

U.S. PATENT DOCUMENTS

| 7,361,877 | B2 | 4/2008 | McGrath et al. |
| 7,749,874 | B2 | 7/2010 | Drowley et al. |
| 7,825,444 | B2 | 11/2010 | Rhodes et al. |
| 8,009,215 | B2 * | 8/2011 | Adkisson ........... H04N 5/37452 250/208.1 |

(Continued)

OTHER PUBLICATIONS

Lahav, Assaf et al.; "Optimization of Random Telegraph Noise Non Uniformity in a CMOS Pixel with a pinned-photodiode", Tower Semiconductor Ltd., 4 pages, (date unknown).

(Continued)

*Primary Examiner* — Gary C Vieaux
(74) *Attorney, Agent, or Firm* — Bever, Hoffman & Harms, LLP

(57) ABSTRACT

A global shutter (GS) image sensor pixel includes a pinned photodiode connected to a memory node by a first transfer gate transistor, and a floating diffusion connected to the memory node by a second transfer gate transistor. The memory node includes a buried channel portion disposed under the first transfer gate transistor and a contiguous pinned diode portion disposed between the first and second transfer gate transistors, where the two memory node portions have different doping levels such that an intrinsic lateral electrical field drives electrons from the buried channel portion into the pinned diode portion. The floating diffusion node similarly includes a buried channel portion disposed under the second transfer gate transistor and a contiguous pinned diode portion that generate a second intrinsic lateral electrical field that drives electrons into the pinned diode portion of the floating diffusion. A 6T CMOS pixel is disclosed that facilitates low-noise CDS readout.

18 Claims, 12 Drawing Sheets

(56) References Cited

U.S. PATENT DOCUMENTS

| | | |
|---|---|---|
| 8,089,036 B2 | 1/2012 | Manabe |
| 8,138,531 B2 | 3/2012 | Adkisson et al. |
| 2011/0187908 A1* | 8/2011 | Kawahito ......... H01L 27/14603 348/306 |
| 2011/0260059 A1* | 10/2011 | Jiang .................. H01L 27/1461 250/330 |
| 2012/0193692 A1* | 8/2012 | Kawahito ......... H01L 27/14609 257/292 |

OTHER PUBLICATIONS

Lauxtermann, Stefan, et al.; "Comparison of Global Shutter Pixels for CMOS Image Sensors", Teledyne Imaging Sensors (Camarillo, CA), 4 pages (date unknown).

* cited by examiner

IMAGE SENSOR PIXEL WITH MEMORY NODE HAVING BURIED CHANNEL AND DIODE PORTIONS

FIELD OF THE INVENTION

This invention relates to solid state image sensors, and more specifically to solid state image sensors having an electronic Global Shutter (GS).

BACKGROUND OF THE INVENTION

Solid-state image sensors are used in, for example, video cameras, and are presently realized in a number of forms including charge coupled devices (CCDs) and CMOS image sensors. These image sensors are based on a two dimensional array of pixels. Each pixel includes a sensing element that is capable of converting a portion of an optical image into an electronic signal. These electronic signals are then used to regenerate the optical image on, for example, a liquid crystal display (LCD).

More recently, however, CMOS image sensors have gained in popularity. Pure CMOS image sensors have benefited from advances in CMOS technology for microprocessors and ASICs and provide several advantages over CCD imagers. Shrinking lithography, coupled with advanced signal-processing algorithms, sets the stage for sensor array, array control, and image processing on one chip produced using these well-established CMOS techniques. Shrinking lithography should also decrease imagearray cost due to smaller pixels. However, pixels cannot shrink too much, or they have an insufficient light-sensitive area. Nonetheless, shrinking lithography provides reduced metal-line widths that connect transistors and buses in the array.

CMOS image sensors utilize either a rolling shutter (RS) methodology or a global shutter (GS) methodology to capture image data (i.e., to expose the image sensor's pixel array to light from a subject image to be captured). The rolling shutter methodology captures the image on a row-by-row basis (i.e., the image portion applied on a given pixel row is converted to captured charges by the corresponding photodiodes, the captured charges are transferred to floating diffusion nodes and then read out by way of column lines, and then the process is repeated for the next sequential pixel row). In the resulting image data, the captured charges from each row represent the subject image at a different time, so the rolling shutter methodology is non-optimal for capturing highly dynamic events (e.g., high-speed objects). In contrast, the GS methodology involves causing every pixel in a pixel array to capture associated portions of a subject image at the same time, thereby facilitating the capture of highly dynamic events. The captured image is then read out of the pixels, typically in a row-by-row fashion using a rolling shutter (RS) readout operation.

An exemplary general GS pixel arrangement for a CMOS image sensor is disclosed in U.S. Pat. No. 8,138,531 to J. W. Adkisson (2012), and includes five transistors and a floating diffusion (FD) that stores the captured image (charge) information until it is read out during a RS readout operation. That is, the image information (captured charge) generated in the photodiode of each GS pixel is transferred to and temporarily stored in the FD of each GS pixel, and then the captured charges are systematically (e.g., row by row) read out of the FD of each pixel (e.g., one row of pixels at a time) during the RS operation.

The general 5T GS pixel approach and similar approaches encounter problems including signal noise and charge generation during readout. As mentioned above, captured light signals (electrons) are transferred to the FDs in all the pixels in the array at the same time, and then the captured signals stored in the FDs are read out row-by-row. The readout sequence performed on a selected row (which is sequentially repeated for all of the rows in the array) includes (a) reading the captured signals stored on all of the FDs in the selected row (i.e., by coupling the captured signals to a column line and reading the column line), (b) resetting the FDs in the selected row (i.e., evacuating electrons from the FDs until a Dark\Reset level is achieved), and then (c) reading the reset level stored on all of the FDs in the selected row (for comparison with the captured signal). Because the reset level is not the same level that was used to transfer the electrons, there is noise associated with it. The charge generation problem arises because the general GS pixel arrangement requires storage of the captured signals in the FDs of different rows for different amounts of time—i.e., when captured signals are sequentially read out starting with an uppermost row and ending with a lowermost row, the captured signals stored in the uppermost (i.e., first-read) row are stored for a shorter amount of time than the captured signals stored in the lower rows of the array, with the captured signals in the lowermost row being stored the longest amount of time. The lower rows, especially when not illuminated (i.e., when exposed to a relatively dark portion of a captured image), will suffer from parasitic charge generation due to a contact in the FD (storage) node which strongly increases generation, thereby corrupting the captured image. This charge generation problem is one of the main incentives for providing GS image sensors with the fastest possible readout process.

One approach used to reduce readout noise in GS image sensors includes providing each GS pixel with an additional storage node (referred to herein as a memory node (MN)), and reading out the captured charge using a correlated double sampling (CDS) readout operation. U.S. Pat. No. 7,361,877 to R. D. McGrath (2006) discloses an exemplary GS pixel utilizing a pinned photodiode, two storage nodes and two transfer gates, where the first transfer gate is used to transfer a captured charge from a pinned photodiode (first pinned diode) to a MN (second pinned diode), and the second transfer gate transfers the captured charge from the MN to a FD (sense node) during the RS operation. The CDS readout operation is perform by first resetting the FD and reading the reset level (typically referred to as a sample-and-hold reset (SHR) signal value), and then transferring the captured charge from the pixel's MN to the pixel's FD, and then reading the image bit level generated by the captured charge (typically referred to as a sample-and-hold image (SHS) signal value). The image bit level and the reset level are then correlated to provide the CDS readout value for that pixel. This CDS readout approach cancels out the kt/c associated with reset operations, which is otherwise dominant in low light.

In order to achieve optimal performance using the additional storage node approach, the MN must be optimized such that all the captured charge is transferred to the FD during CDS readout. That is, the two transfer gates and MN must be operably controlled to affect full charge transfer of the captured charge from the first pinned diode to the MN, and to affect the subsequent full charge transfer of the stored charge from the MN to the FD. In addition, the transfer gates must cooperate to effect good shutter performance of the MN (i.e., such that the MN exhibits low leakage, meaning low generation/recombination rates both in the dark and in the light).

The conventional additional storage node approach mentioned above fails to achieve optimal performance for several reasons. First, similar to the general 5T GS pixel approach (described above), captured charges are stored in the MN during the RS readout process (i.e., the captured charges are transferred to the FD only in the selected row), which subjects the captured charges to delay effects (generation) similar to those encountered in the general 5T GS pixel approach, although the applied parasitic generation current is arguably reduced over that encountered in the general 5T GS pixel approach by use of the pinned MN. Second, energy barriers for electrons prevent the full charge transfer from the pinned photodiode to the MN, and from the and MN to FD, which gives rise to image artifacts including image lag (i.e., when electrons that remain in the pinned diode or the MN are read at the next GS operation as an unwanted signal, and can be especially pronounced if the pixel collected photons from a bright source in the current GS operation). In order to operate correctly, there should be a built in potential difference between the pinned photodiode and the pinned memory node, but this potential difference is very difficult to achieve using the conventional power supply typically available in present-day CMOS process technologies (i.e., 0.18 micron process flows or smaller). For example, using a 0.18 micron CMOS process technology providing a 3.3V power supply, the inventors usually set the pinned photodiode to the maximum potential of about 1.5V and the FD/MN to about 3V to ensure a swing of about 1.5V before charge sharing in "high light" exposures and very good transfer in "low light" exposures. If is approach is applied to pixels of the conventional additional storage node approach, the pinned photodiode would require a maximum potential of 1.5V, the pinned MN diode would require 3V, and the FD would require 4.5V, which cannot be supported with the available 3.3V power supply. Further, even if an elevated supply voltage were available, there would still a problem to implement the MN pinned diode with the high maximum potential. Besides the design overhead when using higher voltages, additional problems can be anticipated. For example, supplying 4.5V from a charge pump is not a good solution because, at higher voltages, the generation current (electron generation rate) in the MN would be higher, and parasitic signals would appear, especially for the rows that are read out last. Thus, low light pixels read from rows at the end of a frame may appear erroneously brighter. Another problem with the conventional additional storage node approach mentioned above is that this approach suggests a p-shield, which actually increases the Vt in a part of the first transfer transistor, thus creating an additional potential barrier during electron transfer.

Various other prior art approaches attempt to achieve low-noise, full-charge-readout GS operations, but all of these prior art approaches also encounter problems. One prior art approach that attempts to modify noise reduction in GS pixels (such as those mentioned above) in order to achieve full-charge-readout is to enhance the lateral field in the transfer gate channel region. Various methods to create such a field have been investigated. For example, Boron implantation at the edge facing the photodiode was attempted, but was proven to be inefficient because the doping profile was deep and barrier lowering for electrons was difficult to achieve. Another approach taught in U.S. Pat. No. 7,825,444 to H. Rhodes (2010) includes an image sensor pixel includes indium doping in the source side of the transfer gate to generate a lateral doping profile, but the approach causes increased Vt, which in turn requires increased pixel operating voltages. Another prior art approach taught in U.S. Pat. No. 8,089,036 to Manabe et al (2012) provides an image sensor with global shutter and in-pixel storage transistor that utilizes 8T GS pixels and a CCD operation principle to possibility reduce voltage at the MN, but this approach requires two additional lines and two additional gates in comparison to the solution presented below.

What is needed is a CMOS image sensor that supports GS image capture, utilizes low-noise CDS readout operations, and facilitates decreased image distortion effects (i.e., by generation or recombination of charge in the process of the readout from first and last rows) than that of conventional approaches.

SUMMARY OF THE INVENTION

The present invention is directed to a CMOS image sensors in which each pixel includes a photodiode and at least one a memory node disposed in first and second spaced-apart regions of a substrate, and a transfer gate that facilitates transferring captured charges from the photodiode to the memory node. According to an aspect of the invention, the memory node of each pixel includes two contiguous doped regions (portions) disposed in the first substrate region and have different doping levels: a memory node (first) buried channel portion that is disposed under part of the first transfer gate and having a first doping level, and a memory node (first) diode portion disposed below the space separating the first transfer gate and the second transfer gate and having a (second) doping level that is greater (stronger) than the first doping level of the buried channel portion, whereby the memory node generates an intrinsic (built-in) lateral electric field that drives (biases) electrons from the first buried channel portion into the diode portion of the memory node. In a specific embodiment, a first p-type diffusion is formed under the first buried channel portion and the first diode portion of the memory node to facilitate forming the memory node as a pinned diode structure, and a second p-type diffusion is formed between the first buried channel portion and the first diode portion of the memory node and an upper surface of the substrate to ensure the desired operation of the buried channel portion. The resulting intrinsic (built-in) lateral electric field is particularly useful when the pixel is utilized in a global shutter (GS) image sensor. That is, by providing memory node with this lateral electric field, electrons are driven more quickly from the buried channel portion into the memory node diode portion, thereby reducing dark current and decreasing image distortion in comparison with conventional GS image sensor approaches (i.e., by reducing the generation or recombination of charge in the process of a rolling shutter readout operation from first and last rows in an image sensor array). In addition, because the lateral electric field is "built-in" (i.e., exists despite the absence of an external supplied bias voltage), the present invention facilitates the use of lower pixel operating voltages. As such, the present invention facilitates the production of superior GS CMOS image sensors using present-day CMOS process technologies (i.e., 0.18 micron process flows or smaller) that exhibit superior charge transfer efficiency from the photodiode to the memory node, and from the memory node to the floating diffusion during a rolling shutter readout operation. However, although the two-part memory node structure may be particularly useful in the 6T GS CMOS image sensor arrangement described herein, the present invention may also be beneficially utilized, for example, to improve the transfer of captured charges from a pinned diode to a floating diffusion in CMOS image sensors utilizing other (e.g., 4T) pixel arrangements, or to transfer (introduce) charges in CCD or CMOS Image Sensor (CIS) systems.

According to a presently preferred embodiment of the invention, each pixel further includes a floating diffusion disposed in a third region of the substrate, and a second transfer gate transistor connected between the memory node and the floating diffusion (i.e., the second transfer gate transistor controls electron flow from the memory node to the floating diffusion). In one specific embodiment, the floating diffusion of each pixel includes at least two contiguous doped regions similar to those of the memory node that generate a second intrinsic (built-in) lateral electrical field. Specifically, the floating diffusion includes a floating diffusion (second) buried channel portion disposed under the second transfer gate having a (third) doping level, and a diode portion disposed adjacent to (but not under) the second transfer gate and having a fourth doping level that is greater than the third doping level of the buried channel portion. Similar to the lateral electrical field of the memory node, the lateral electrical field of the floating diffusion functions to drive (bias) electrons from the floating channel buried channel portion into the floating channel diode portion in a way that produces more complete transfer of captured charge from the memory node to the floating diffusion, whereby the combination of the two-part memory node and the floating diffusion further facilitate the fabrication of GS CMOS image sensors by preventing dark current during rolling shutter (RS) readout operations.

According to another embodiment of the present invention, the various diode structures of each pixel are fabricated with doping profiles configured to generate relative maximum charge potentials that progressively increase as the capture charge is passed from the photodiode to the memory node to the floating diffusion. In one specific embodiment, the buried channel portion of the memory node is formed using a (first) n-type dopant having a first doping level, the memory node diode portion is produced by combining the (first) n-type dopant of the first doping process with a second n-type dopant to generate the second dopant level such that a maximum potential of the memory node diode portion is greater than that of the memory node buried channel portion. The buried channel and diode portions of the memory node are sandwiched between a p- doped diffusion layer that ensures buried channel characteristics, and a p+doped diffusion layer that forms part of the pinned diode structure of the memory node. The formation of the buried channel portion using the first dopant and the memory node diode portion by combining the first dopant and a second dopant provides a cost-effective and accurate methodology for generating the lateral electrical field of the memory node. According to another embodiment of the present invention, the various diode structures of each pixel are fabricated with doping profiles configured to generate relative maximum charge potentials that progressively increase as the capture charge is passed from the photodiode to the memory node to the floating diffusion. Specifically, the photodiode's diode portion is fabricated with a (first) maximum charge potential that is less than (i.e., has a lower potential than) the (second) maximum charge potential of the memory node diode portion (e.g., in the range of 0.1V to 0.5V lower), and the floating diffusion (third) diode portion is fabricated with a (third) maximum charge potential that is greater than (i.e., has a higher potential than) the (second) maximum charge potential of the memory node diode portion. By providing the memory node with a potential well having a maximum potential that is greater than that of the photodiode, and by providing the floating diffusion with a maximum potential that is greater than the maximum potential of the memory node, GS pixels formed in accordance with the present invention are operably controlled using lower operating voltages, exhibit lower dark currents, and achieve superior charge transfer between the photodiode, memory node and floating diffusion, thereby facilitating the fabrication of GS CMOS image sensors having superior performance than is achievable using conventional methods.

According to another feature, the memory node and floating diffusion of each pixel are shielded from light by a light shield (e.g., a metal structure formed during metallization layer processing) that extends over the floating diffusion, the second transfer gate, the memory node, and at least a portion of the first transfer gate. With this light shielding arrangement, both the memory node and the floating diffusion are protected from "parasitic" photons that cause corruption of data.

According to a practical embodiment of the present invention, a global shutter (GS) image sensor includes an array of six-transistor (6T) pixels and associated control circuitry configured to a capture image information by way of a global shutter image capture operation followed by a rolling shutter readout operation. Each 6T pixel includes the photodiode, first transfer gate transistor, memory node, second transfer gate transistor and floating diffusion formed and arranged in the manner mentioned above. In addition, each 6T pixel further includes a reset transistor connected between a voltage source and the floating diffusion and controlled by a reset control signal, a global reset transistor connected between the voltage source and the photodiode and controlled by a global reset signal, a source-follower transistor connected to the voltage source and controlled by a charge stored on the floating diffusion, and a row-select transistor connected between said source-follower transistor and a readout signal line and controlled by a row select control signal. The 6T pixels provide the significant operating advantages described above and facilitate GS operations using only one more transistor than used in conventional 5T GS pixels.

According to a specific embodiment, various portions of the control circuit are utilized during operation of the GS image sensor to generate the various control signals mentioned above in order to cause all of the 6T pixels to simultaneously capture charges (image portions) during the global shutter image capture operation, and to read-out the captured charges from the 6T pixels on a row-by-row bases during the rolling shutter readout operation. First, a global reset control signal is transmitted to the global reset transistor in all of the 6T pixels that resets the charge stored on the photodiodes during a pre-integration phase of the global shutter image capture operation, then the global reset control signal is de-asserted such that the photodiodes of each 6T pixel generates (collects) a captured charge in accordance with an amount of light received during an integration (first) phase of the global shutter image capture operation, and then a first transfer gate control signal to the first transfer gate transistor that causes each 6T pixel to transfer its captured charge from its photodiode to its memory node during a charge transfer (second) phase of the global shutter image capture operation. The rolling shutter readout operation is then performed using a correlated double sampling (CDS) readout scheme in which the pixel rows are sequentially accessed during corresponding row-select time period, and SHR control signals and SHS control signals are transmitted only to the 6T pixels of one selected row during each corresponding row-select time period. During an SHR (first) phase of each row-select time period, each 6T pixel of the selected row is controlled by SHR control signals such that its floating diffusion stores a reset charge that is transmitted onto an associated column line as an SHR value. During the subsequent SHS (second) phase of each row-select time period, each 6T pixel of the selected row is controlled by SHR control signals to transfer its captured charge from its memory node to its floating diffusion of each said pixel, which is then transmitted onto the associated column line as an SHS value. By controlling the 6T pixels to perform CDS readout operations in this manner, the present invention facilitates further noise reduction in the image data read out from the array.

According to a preferred embodiment, both the photodiode and memory node in each pixel comprise pinned diode structures. As mentioned above, the generation of the intrinsic lateral electrical field drives electrons more quickly into the memory node diode portion, whereby pixels generated in accordance with the present invention provide the benefit of utilizing pinned diode structures (i.e., the reduction of parasitic current generation) without experiencing the delay effects associated with conventional GS approaches. According to a feature of the practical GS image sensor embodiment described above, due to the pinned diode structures and the presence of the memory node buried channel region, the first transfer gate transistor of each 6T pixel is controllable using only two voltage levels (i.e., transfer gate control signal TX1 is either VDD or 0V). This is a very attractive feature because it avoids the need for a third "store" control voltage and associated three-level drivers, which are needed in pixel arrangements that require charge storage under the transfer gate, thus simplifying the control circuit and reducing overall costs.

BRIEF DESCRIPTION OF THE DRAWINGS

These and other features, aspects and advantages of the present invention will become better understood with regard to the following description, appended claims, and accompanying drawings, where:

DETAILED DESCRIPTION OF THE DRAWINGS

The present invention relates to an improvement in CMOS image sensors, and more particularly to improvements in global shutter (GS) CMOS image sensors for use in machine vision and in other high resolution applications that require low noise global shutter operation. The following description is presented to enable one of ordinary skill in the art to make and use the invention as provided in the context of a particular application and its requirements. The terms "coupled" and "connected", which are utilized herein, are defined as follows. The term "connected" is used to describe a direct connection between two circuit elements, for example, by way of a metal line formed in accordance with normal integrated circuit fabrication techniques. In contrast, the term "coupled" is used to describe either a direct connection or an indirect connection between two circuit elements. For example, two coupled elements may be directly connected by way of a metal line, or indirectly connected by way of an intervening circuit element (e.g., a capacitor, resistor, inductor, or by way of the source/drain terminals of a transistor). In addition, relative terms such as "upper", "above", "below" and "under" are intended to denote relative differences, and not intended to be literally interpreted unless otherwise specified. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1A:
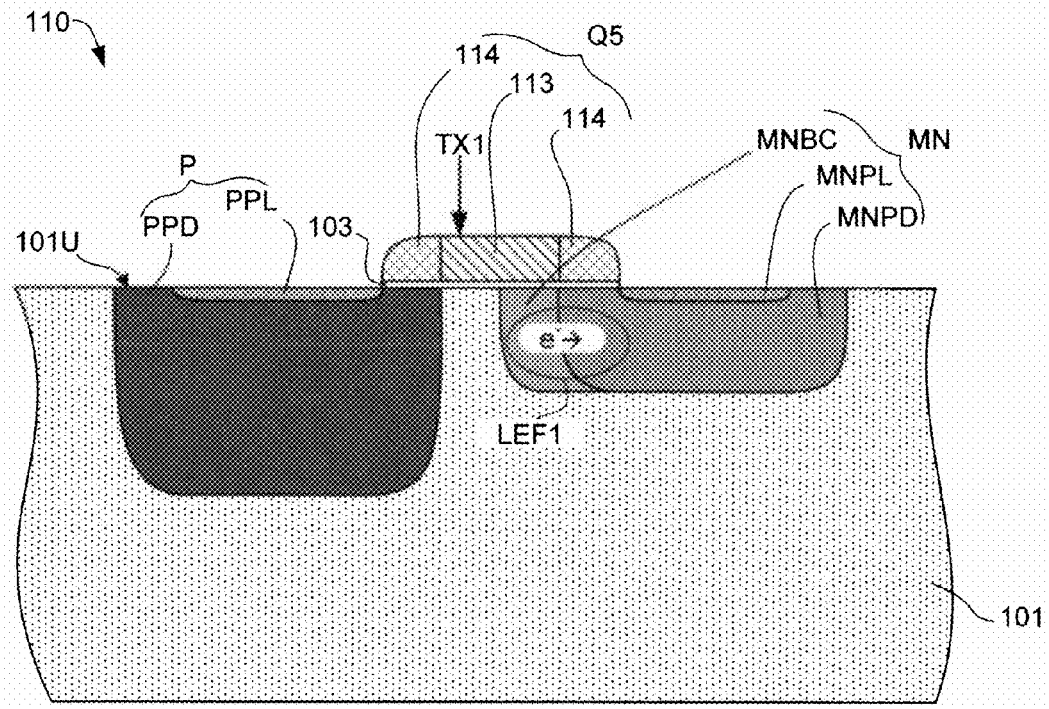
FIG. 1A is a cross-sectional diagram showing a partial GS pixel according to an embodiment of the present invention.
Figure 5:
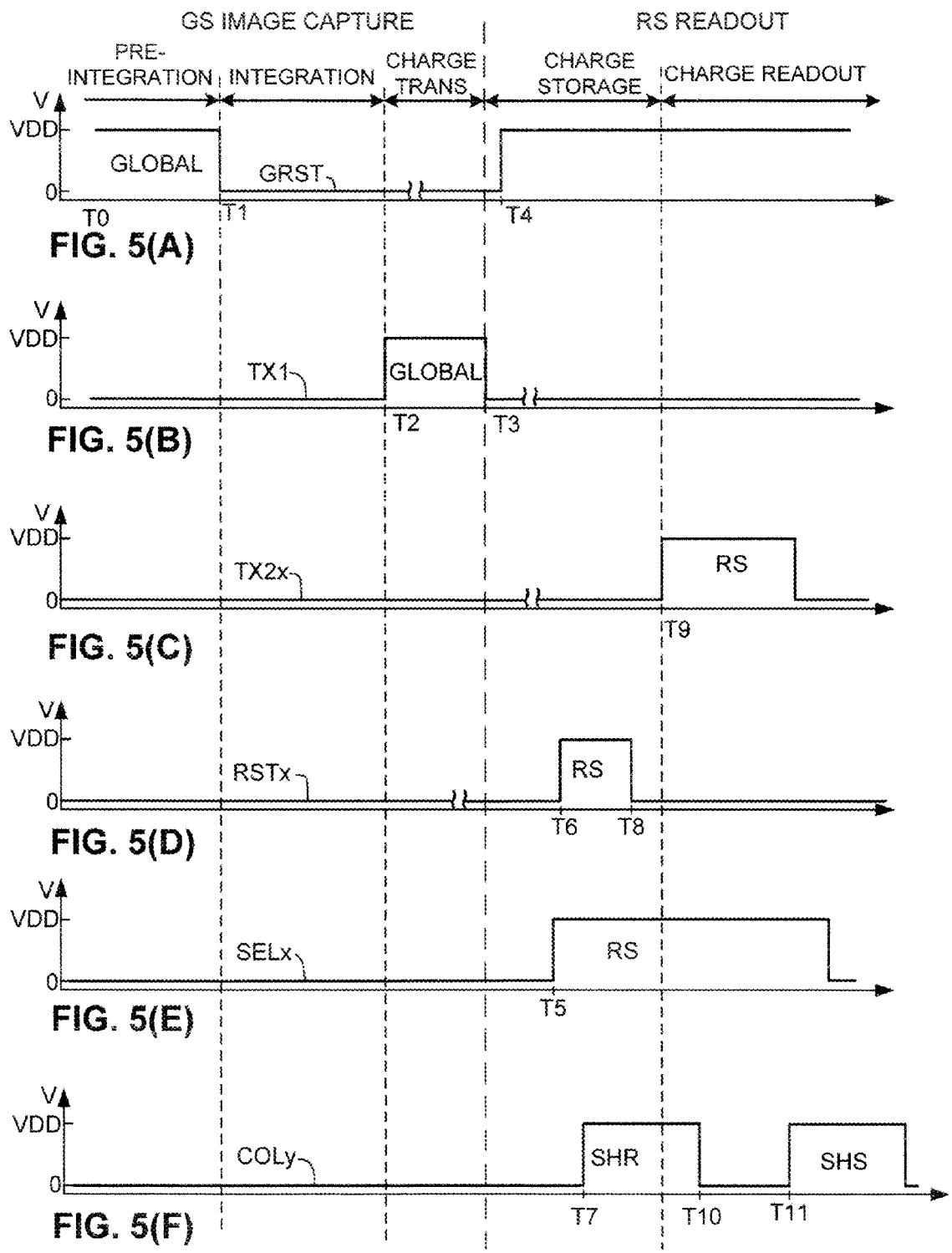
FIGS. 5(A), 5(B), 5(C), 5(D), 5(E) and 5(F) are timing diagrams showing signal levels during operation of the GS pixel of FIG. 4 according to an exemplary embodiment of the present invention.

FIG. 1(A) shows a partial global shutter (GS) pixel 110 formed in a substrate 101 according to a simplified embodiment. Pixel 110 is understood as being one of many pixels forming a GS image sensor in the manner set forth below, and is not intended to represent a fully functional pixel. That is, FIG. 1(A) illustrates only structures of pixel 110 that are considered novel with respect to conventional approaches, and additional structures required to implement a functional pixel circuit are omitted for clarity. Specifically, a second storage element (e.g., the floating diffusion discussed below)

and pixel control elements (e.g., additional transfer gate, reset, source-follower and select transistors needed to allow pixel 110 to capture, store and readout image information) are omitted from FIG. 1(A) to more clearly depict the novel structures and features, and because these control portions may be implemented using a number of different circuit arrangements in combination with the depicted novel structures and features. That is, although more complete pixel arrangements including the novel structures of FIG. 1(A) are described below (e.g., with reference to the six-transistor (6T) pixel shown in FIG. 5, discussed below), the novel structures and features may also be beneficially utilized in other pixel arrangements.

Referring to FIG. 1(A), pixel 110 includes a photodiode P, a memory node MN and a transfer gate transistor (first transfer gate) Q5 disposed on a gate oxide layer 103 that is formed on an upper surface 101U of substrate 101 using known techniques. Photodiode P is formed by one or more dopants diffused into a first region of substrate 101, and memory node MN is formed by dopants diffused into a second region of the substrate, where the first and second regions are spaced apart from each other. Transfer gate Q5 includes a doped polycrystalline silicon (polysilicon) gate structure 113 and associated sidewall spacers 114 that are formed using known techniques, and is operably disposed over a channel (gap) separating photodiode P and memory node MN such that a flow of electrons between photodiode P and memory node MN is controlled by (first) transfer gate control signal TX1.

According to an aspect of the present invention, memory node MN includes two or more contiguous doped regions having different doping levels that are configured to generate an intrinsic (built-in) lateral electric field LEF1 that facilitates the transfer of captured charges from photodiode P to memory node MN. In the embodiment depicted in FIG. 1(A), memory node MN includes two contiguous doped regions referred to as (first) buried channel portion MNBC and (first) diode portion MNPD. Buried channel portion MNBC is formed by a first diffused dopant material using the modified CMOS technique described below such that it is disposed under a portion of transfer gate Q5 and has a first doping level, and diode portion MNPD is formed by a second dopant material (i.e., a different dopant material or a combination of the first dopant material with a different dopant material) such that diode portion MNPD is disposed between buried channel portion MNBC and floating diffusion FD and has a second doping level. To generate intrinsic lateral electric field LEF1, the second doping level of diode portion MNPD is greater (higher or stronger) than the first doping level of buried channel portion MNBC, whereby electrons are driven (biased) by lateral electrical field LEF1 from buried channel portion MNBC into diode portion MNPD (i.e., as depicted by "e−" and the rightward-pointing arrow superimposed onto memory node MN in FIG. 1(A)). As explained in additional detail below, providing memory node MN with lateral electric field LEF1 facilitates driving electrons more quickly from buried channel portion MNBC into node diode portion of the memory, thereby reducing dark current and decreasing image distortion in comparison with conventional approaches (i.e., by reducing the generation or recombination of charge in the process of a rolling shutter readout operation from first and last rows in an image sensor array). In addition, because lateral electric field LEF1 is "built-in" (i.e., exists despite the absence of an external supplied bias voltage), the present invention facilitates the use of lower pixel operating voltages. As such, the present invention facilitates the production of superior GS CMOS image sensors using present-day CMOS process technologies (i.e., 0.18 micron process flows or smaller) that provide superior charge transfer efficiency from photodiode P to memory node MN, and from memory node MN to floating diffusion FD during a rolling shutter readout operation.

According to a preferred embodiment, both photodiode P and memory node MN comprise pinned diode structures. Photodiode P is configured using known techniques to generate a captured charge in accordance with an amount of light received by pixel 110 during an integration phase of a global shutter image capture operation, such as that described in further detail below. In the preferred embodiment, as indicated in FIG. 1(A), photodiode P includes a photodiode structure PPD (e.g., an N-PD diffusion extending downward from upper surface 101U) and a (first) pinning layer PPL (e.g., formed by a shallow p+ diffusion layer disposed adjacent to upper surface 101U). Similarly, memory node MN is configured using known techniques to store a captured charge transferred from photodiode P during a charge transfer phase of a global shutter image capture operation, such as that described in further detail below, and includes a (second) pinning layer MNPL (e.g., formed by a p+ dopant disposed adjacent to upper surface 101U) that is disposed in memory node diode portion MNPD. Similar to that achieved in conventional approaches, the benefit of implementing photodiode P and memory node MN using pinned diode structures is that this arrangement reduces parasitic current generation. However, unlike the conventional approaches, the delay effects associated with using pinned diode structures is avoided in the present invention by way of lateral electrical field LEF1.

Figure 1B:
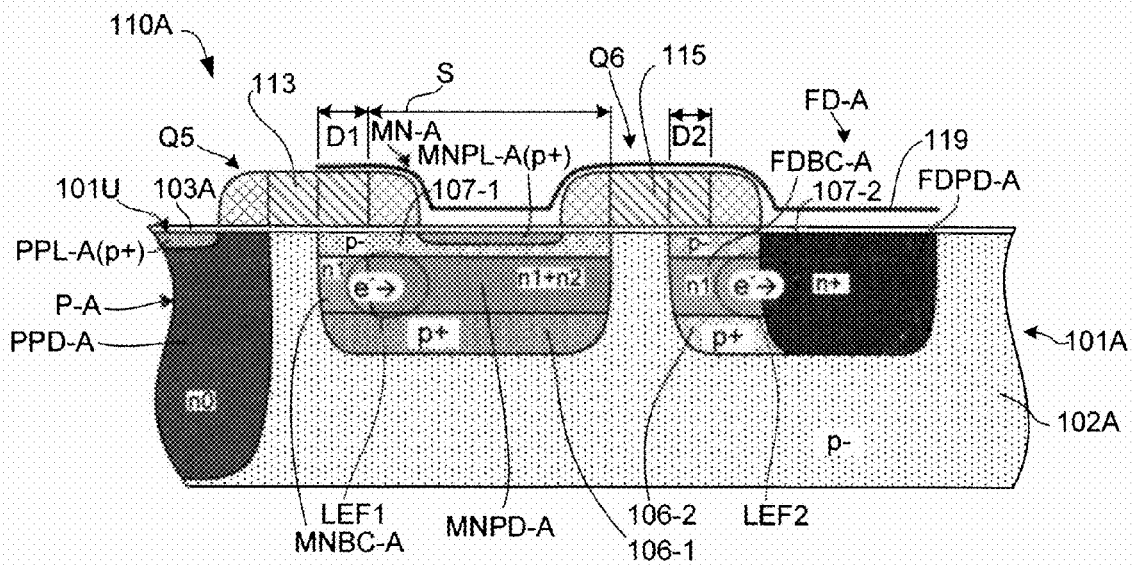
FIG. 1B is a simplified cross-sectional side view showing a portion of a GS pixel according to an alternative embodiment of the present invention.

FIG. 1(B) shows a partial global shutter (GS) pixel 110A formed in a substrate 101A according to an alternative simplified embodiment of the present invention. Similar to FIG. 1(A), FIG. 1(B) illustrates only structures of pixel 110A that are considered novel with respect to conventional approaches, and additional structures required to implement a functional pixel circuit are omitted for clarity.

Pixel 110A includes a photodiode P-A (which is partially shown), a memory node MN-A and a floating diffusion FD-A formed in substrate 101A, first transfer gate Q5, and a second transfer gate transistor (second transfer gate) Q6 disposed on gate oxide layer 103A formed on an upper surface 101U of substrate 101A. Floating diffusion FD is formed by dopants diffused into a third region of the substrate that is spaced from the first and second regions (i.e., floating diffusion FD-A is separated from memory node MN-A and photodiode P-A by substrate material having an opposite doping type). As in pixel 110 (FIG. 1(A), transfer gate Q5 includes a polysilicon gate structure 113 and associated sidewall spacers 114, and is operably disposed over a channel (gap) separating photodiode P-A and memory node MN-A and is controlled by transfer gate control signal TX1. Transfer gate Q6 also includes a doped polysilicon gate structure 115 and associated sidewall spacers 116, and is operably disposed over a channel (gap) separating memory node MN-A and floating diffusion FD-A such that a flow of electrons between memory node MN-A and floating diffusion FD-A is controlled by (second) transfer gate control signal TX2.

For descriptive purposes, pixel 110A is illustrated in FIG. 1(B) as being formed in a p-type diffusion region 103A of substrate 101A, with each of photodiode P-A, memory node MN-A and floating diffusion FD-A including at least one n-type diffusion disposed in p-type substrate region 103A. For example, photodiode P-A includes photodiode portion PPD-A formed with an associated n-type dopant profile (labeled "n0" to distinguish this dopant profile from the other n-type dopant profiles used in memory node MN-A and floating diffusion FD-A) and a p+ pinning layer PPL-A. Memory node MN-A includes buried channel portion MNBC-A formed with an associated (first) n-type dopant profile n1 that extends a distance D1 under polysilicon gate structure 113 of transfer gate transistor Q5, a diode portion MNPD-A formed with an associated second n-type dopant profile (labeled "n1+n2" to distinguish this dopant profile from dopant profile n1) that is disposed in the gap region formed between transfer gate transistors Q5 and Q6, and a p+ pinning layer MNPL-A formed in the surface of substrate 101A between transfer gate transistors Q5 and Q6. In addition, a (first) p-type diffusion 106-1 is formed under buried channel portion MNBC-A and diode portion MNPD-A to facilitate function of memory node MN-A as a pinned diode structure, and a (second) p-type diffusion 107-1 is formed between buried channel portion MNBC-A and diode portion MNPD-A and upper substrate surface 101U to ensure the desired operation of the buried channel portion MNBC-A (i.e., p-type diffusion 107-1 acts as a diffusion barrier for photoelectrons that are not collected by the diode structure). The composition and depth of diffusion 107-1 depends on several factors including the resistivity of the n-type dopants forming buried channel portion MNBC-A and diode portion MNPD-A.

According to another embodiment, in addition to forming memory node MN-A using two or more contiguous doped regions having different doping levels, floating diffusion FD-A is also formed using two or more contiguous doped regions having different doping levels that are configured to generate a second intrinsic (built-in) lateral electric field LEF2 that facilitates the transfer of captured charges from memory node MN-A to floating diffusion FD-A. In the embodiment depicted in FIG. 1(B), floating diffusion FD-A includes two contiguous doped regions referred to as (second) buried channel portion FDBC-A and (second) diode portion FDPD-A, where buried channel portion FDBC-A is formed with n-type dopant profile n1, and a diode portion FDPD-A is formed with an associated third n-type dopant profile (labeled "n+" to distinguish this dopant profile from that of diode portion MNPD-A). The n1 material forming buried channel portion FDBC-A is disposed under a portion of transfer gate Q6 (i.e., extends from diode portion FDPD-A a distance D2 under polysilicon gate structure 115) and has an associated (third) doping level (which may be equal to the first doping level of buried channel portion MNBC-A). Diode portion FDPD-A is formed by dopant material disposed to the right of transfer gate Q6 and having a fourth doping level. To generate intrinsic lateral electric field LEF2, the (fourth) doping level of diode portion FDPD is greater (higher or stronger) than the (third) doping level of buried channel portion FDBC-A, whereby electrons are driven by lateral electrical field LEF2 from buried channel portion FDBC-A into diode portion FDPD-A (i.e., as depicted by "e−" and the rightward-pointing arrow superimposed onto floating diffusion FD in FIG. 1(B)). A p-type diffusion 107-2 having the same composition as diffusion 107-1 is formed between buried channel portion FDBC-A and upper substrate surface 101U to ensure the desired buried channel operation, and a p-type diffusion 106-2 is formed under buried channel portion FDBC-A having the same composition as that of diffusion 106-1. As explained in additional detail below, providing memory node MN-A with lateral electrical field LEF1 and floating diffusion FD-A with lateral electric field LEF2 facilitates further reducing dark currents and decreasing image distortion in comparison with conventional approaches, and further facilitates the use of lower pixel operating voltages, thereby facilitating the production of superior GS CMOS image sensors using present-day CMOS process technologies that provide superior charge transfer efficiency from photodiode P-A to memory node MN-A, and from memory node MN-A to floating diffusion FD-A during a rolling shutter readout operation.

According to another feature of the preferred embodiment illustrated in FIG. 1(B), buried channel portions FDBC-A and MNBC-A are formed using the same (first) n-type dopant n1 (i.e., buried channel portions FDBC-A and MNBC-A are simultaneously formed during the same diffusion process), diode portion MNPD-A of memory node MN-A consists essentially of a combination of n-type dopant n1 and a second n-type dopant n2 that provides memory node MN-A with a greater maximum potential than that of photodiode P-A, and diode portion FDPD-A of floating diffusion FD-A comprises a different (third) n-type dopant n+ that provides floating diffusion FD-A with a greater maximum potential than that of memory node MN-A. That is, as described in additional detail below, the potential well of diode portion MNPD-A has a maximum potential that is greater than the maximum potential of photodiode P-A, and the potential well of diode portion FDPD-A has a maximum potential that is greater than the maximum potential of diode portion MNPD-A. By providing memory node MN-A with a greater maximum potential than that of photodiode P-A, and by providing floating diffusion FD-A with a greater maximum potential than that of memory node MN-A, pixel 110A can be controlled using lower operating voltages, exhibits lower dark currents, and achieves superior charge transfer that is superior to that achievable using conventional methods.

According to another feature of the preferred embodiment illustrated in FIG. 1(B), memory node MN-A is shielded from light by an integral metallization (e.g., M1) structure 119 disposed over floating diffusion FD, transfer gate Q6, memory node MN-A, and the portion of transfer gate Q5 disposed over buried channel portion MNBC-A. With this light shielding arrangement, both memory node MN-A and floating diffusion FD-A are protected from "parasitic" photons that cause corruption of data.

Figure 2:
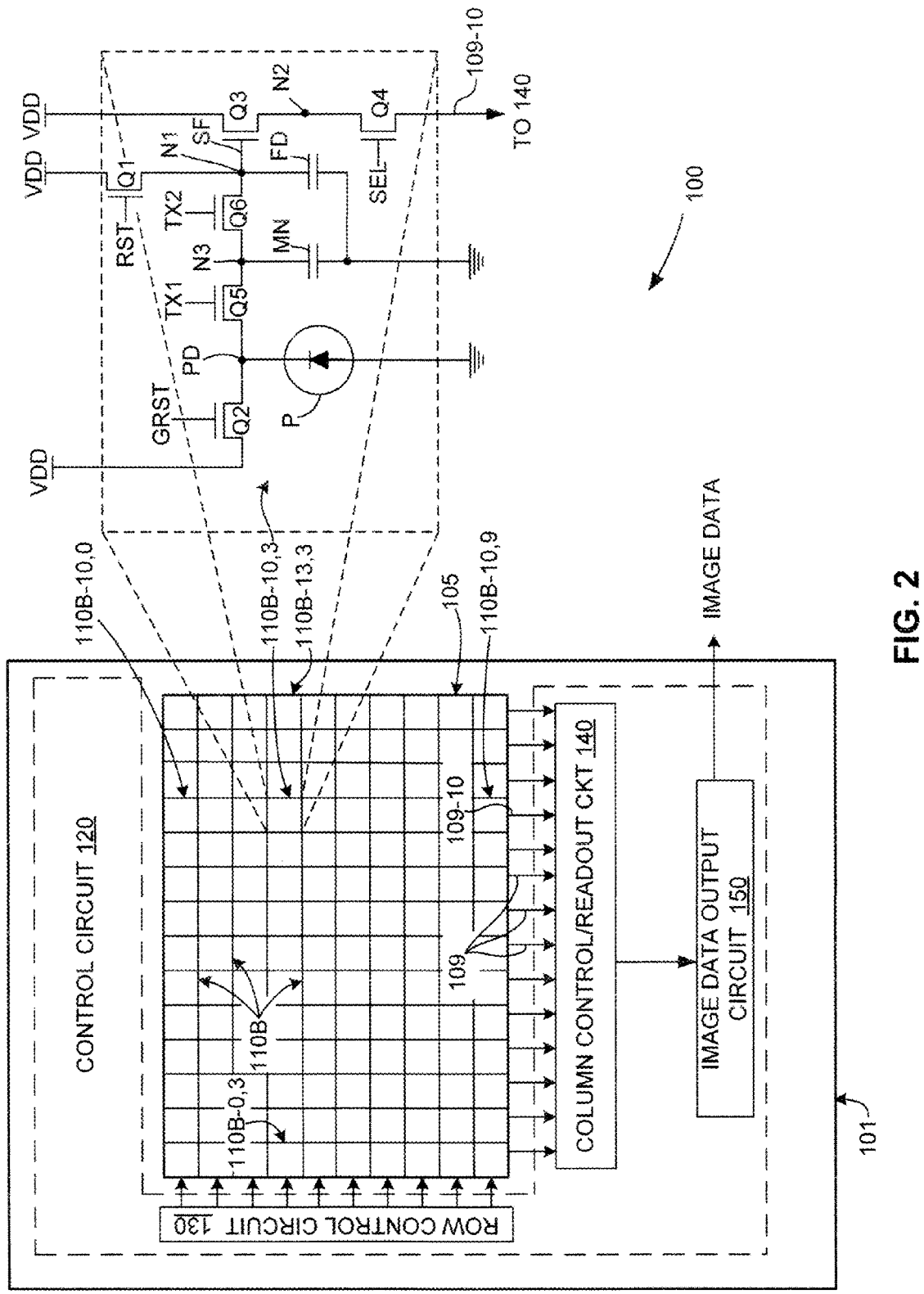
FIG. 2 is a simplified circuit diagram showing a GS CMOS image sensor according to another embodiment of the present invention.

FIG. 2 is a simplified diagram showing a simplified GS CMOS image sensor 100 formed in accordance with a simplified embodiment of the present invention. CMOS image sensor 100 is similar to conventional GS CMOS image sensors in that it is formed on a semiconductor (e.g., monocrystalline silicon) substrate 101 using CMOS fabrication techniques, and includes a pixel array 105 including pixels 110B, which are consistent with the pixels described above with reference to FIGS. 1(A) and 1(B)), and are arranged in rows and columns. CMOS image sensor 100 also includes a control circuit 120 that facilitate control over pixels 110B by way of associated metal control lines (not shown) passing between the rows and columns of pixel array 105 such that all pixels 110B of array 105 are controlled to simultaneously capture associated charges (light image portions) during a global shutter image capture operation, and then to transfer the captured charges in a rolling shutter (row-by-row) readout operation.

In the exemplary simplified embodiment, pixel array 105 is arranged such that the columns of pixels 110B are aligned vertically, and the pixel rows are aligned horizontally. For example, pixels 110B-10,0, 110B-10,3, and 110B-10,9, which are aligned vertically in FIG. 2, form one of fourteen pixel columns, and pixels 110B-0,3, 110B-10,3, and 110B-13,3, which are arranged horizontally, form one of ten pixel rows. Similar to other global shutter image sensors, all pixels 110B of array 105 are simultaneously exposed to capture light from a subject image during an integration phase, and then the pixel rows are accessed sequentially during a rolling shutter readout operation by way of control signals that are described below, and captured analog signals generated by each pixel are transmitted on column signal lines 109. For example, during a first time period of the RS readout operation, all of the pixels in the first row of pixel array 105 (e.g., pixel 110B-10,0) are accessed using the method described below, and analog values generated by the first row are transmitted onto associated column output signal lines (e.g., signal line 109-10). Those skilled in the art will recognize that pixel array 105 is shown with a small number of pixels for explanatory purposes, and that an actual sensor formed in accordance with the present invention for would typically include between 2,000,000 and 60,000,0000 pixels, although aspects of the present invention may be beneficially utilized in image sensors having fewer pixels or a larger number of pixels.

A simplified 6T GS pixel 110B-10,3, which is exemplary of all pixels 110B in array 105, is shown in an enlarged fashion in the upper right portion of FIG. 1. Consistent with pixel 110 of FIG. 1(A) and pixel 110A of FIG. 1(B), each 6T GS pixel 110 of CMOS image sensor 100 (e.g., pixel 110B-10,3) includes a CMOS pinned photodiode P, a memory node MN, a floating diffusion FD, a first transfer gate transistor Q5 and a second transfer gate transistor Q6. In addition, each 6T GS pixel 110B of CMOS image sensor 100 includes a reset select transistor Q1, a global reset transistor Q2, a source-follower transistor Q3, and a select transistor Q4. Reset transistor Q1 is coupled between system voltage source VDD and a first internal node N1 that is also connected to floating diffusion FD and to the gate terminal of source-follower transistor Q3, and is controlled by a control signal RST. Global reset transistor Q2 is connected between photodiode node PD and voltage source VDD, and is controlled by a global reset signal GRST in the manner set forth below. Source-follower transistor Q3 is connected between system source VDD and a second internal node N2, and is controlled by a voltage present on first node N1 to generate a pixel output signal at node N2. Select transistor Q4 is connected between associated column signal (output) line 109-10 and node N2, and receives a select control signal SEL during the read operations that couples node N2 to signal line 109-10. Memory node MN and floating diffusion FD, which are described above with reference to FIGS. 1(A) and 1(B), are represented by capacitor symbols in FIG. 2 for illustrative purposes, and store captured analog signals (charges) on an internal node N3 and on first node N1, respectively, in the manner described below.

Figure 3:
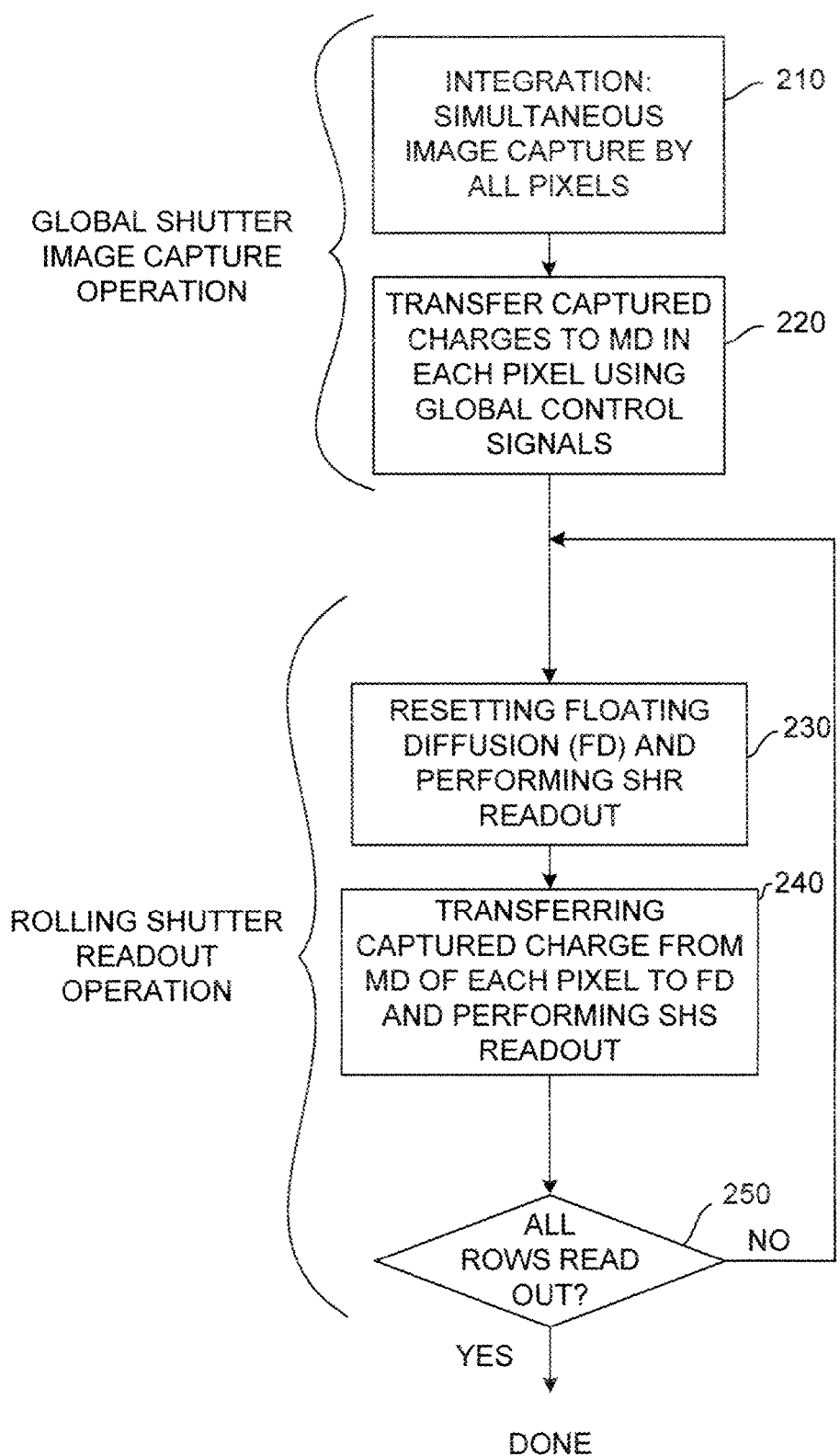
FIG. 3 is flow diagram showing a simplified methodology for generating image data from the GS CMOS image sensor of FIG. 2.

FIG. 3 is a simplified flow diagram depicting the operation of image sensor 100 as a GS image sensor utilizing control circuit 120 (see FIG. 2) according to another embodiment of the present invention. The method generally includes a global shutter image capture operation (blocks 210 and 220) and a rolling shutter readout operation (blocks 230-250). Referring to the upper portion of FIG. 3, the global shutter operation of the method includes an integration phase (block 210) during which all of pixels of the image sensor are controlled using global signals generated by row control circuit 130 such that the photodiode of each pixel simultaneously captures a corresponding charge, and a subsequent transfer phase (block 220) in which all of the pixels are controlled, also using the global signals generated by row control circuit 130, such that the captured charges are simultaneously transferred from the photodiode to the memory node in each pixel. Referring to the lower portion of FIG. 3, after the global shutter readout operation is completed, the rolling shutter readout operation is performed on one row of pixel groups at a time using rolling shutter control signals generated by row control circuit 130 that are repeated for each row until captured charges are read from every row (e.g., with reference to FIG. 2, the readout operation is performed by selecting (addressing) the uppermost row (e.g., the horizontal row including pixel 110B-10,0 in FIG. 2), then selecting the second row, etc., until captured charges are read from every pixel row of image sensor 100. During each row readout operation, all pixels in the selected row are controlled using rolling shutter control signals transmitted only to that row (i.e., these control signals are only sent to the pixels in the selected row currently being read). In the generalized method embodiment of FIG. 2, the rolling shutter readout operation includes (block 230) resetting the floating diffusion and transmitting SHR values (generated by the potential stored on the reset floating diffusion) onto shared output (column) signal lines from each pixel of the selected row, then (block 240) transferring captured charges from the memory node to the floating diffusion in each pixel of the selected row, and then transmitting SHS values (generated by the captured charge transferred to the floating diffusion) from each pixel of the selected row onto the shared output (column) signal lines 109. As indicated by block 250 in FIG. 3, once the readout process is completed for the current selected row (e.g., the uppermost row in FIG. 2), the reset/SHR read/transfer captured charge/SHS read sequence is repeated by transmitting rolling shutter control signals only to the pixels of the next sequential row of array 105, whereby multiple CDS readout operations are performed during which a SHR and SHS values are transmitted onto associated output signal lines 109. This process is then repeated for each row of pixels until all of the captured charges from every pixel of image sensor 100 have been read out.

Figure 4:
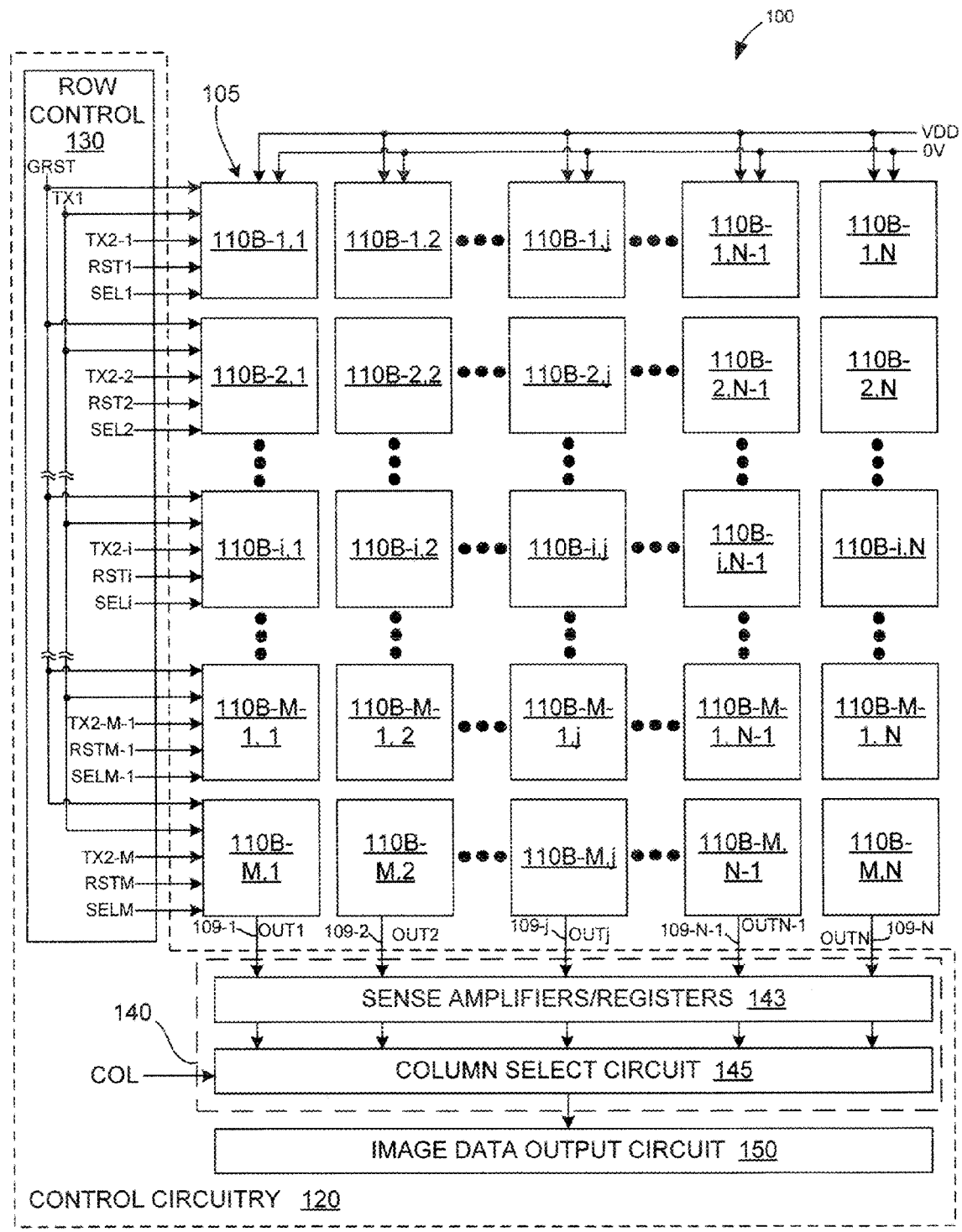
FIG. 4 is a block diagram showing an exemplary pixel array arrangement and associated control signals utilized in the GS CMOS image sensor of FIG. 2.

FIG. 4 is a block diagram showing portions of image sensor 100 in additional detail, wherein pixels 110B-1,1 to 110B-M,N of array 105 are depicted as blocks arranged in an array of horizontal rows and vertical columns, and control circuitry 120 is disposed along a peripheral edge of the array. As set forth above, each pixel 110B-1,1 to 110B-M,N includes circuitry consistent to that of pixel 110B shown in FIG. 2. In accordance with an aspect of the present invention, every row of pixels of array 105 is controlled by two global control signals generated by row control circuit 130 (i.e., global reset signal GRST and first transfer gate control signal TX2), and each row of pixels receives three unique rolling shutter (RS) control signals (e.g., the uppermost row including pixels 110B-1,1 to 110B-1,N receives RS control signals TX2-1, RST1 and SEL1, the second row including pixels 110B-2,1 to 110B-2,N receives RS control signals TX2-2, RST2 and SEL2, etc.). As indicated at the top of the array, two system voltages VDD and 0V are supplied to array 105 during operation. Similar to conventional image sensors, output values OUT1 to OUTN are generated on corresponding column lines 109-1 to 109-N and read by image data output circuit 140 during the RS readout operation. As indicated at the bottom of FIG. 4, image data output circuit 140 generally includes sense amplifier/registers 143 that detect the output signals (image values) utilizing known techniques, and a column select circuit that sequentially transmits the detected image values from the series of sense amplifiers/registers to image data output circuit 150 for storage and transmission to a memory device (not shown). When arranged correctly (i.e., when the pixels are formed with a minimum of internal routing disposed in the interconnect layer between the silicon surface and the M1 metallization layer), the optical openings above the pixels are not compromised by the inter-pixel signal line routing. Similar to conventional image sensors, pixel group output signals OUT1 to OUTN are transmitted along vertical readout signal lines to sense amplifiers/registers circuit 143 for detection.

Control circuit 120 is configured using known techniques to cause image sensor 100 to perform the exemplary image capture/readout operation described below with reference to the simplified timing diagrams shown in FIGS. 5(A) to 5(F). FIGS. 5(A) to 5(E) respectively depict control signals GRST, TX1, TX2x, RSTx and SELx and COLy, which are respectively applied to transistors Q2, Q5, Q6, Q1, Q4 of each pixel 110B of image sensor 100 (see FIG. 2). FIG. 5(F) depicts control signal COLy that controls column select circuit 145 (see FIG. 4). As indicated in row control circuit 130 of FIG. 4 and by the word "GLOBAL" in FIGS. 5(A) and 5(B), global reset signal GRST and transfer gate control signal TX1 are simultaneously transmitted to every row of array 105. As indicated in row control circuit 130 of FIG. 4 and by "RS" (rolling shutter) in FIGS. 5(C), 5(D) and 5(E), transfer gate signal TX2x, reset control signal RSTx and select control signal SELx are separately generated for each pixel row of array 105. For the sake of clarity, the timing diagrams associated with the rolling shutter readout operation are simplified to illustrate exemplary operations associated with one row and one column. That is, the "x" in TS2x, RSTx and SELx indicates that the depicted RS control signals are generated for only one selected pixel row, and it is understood these signals are sequentially generated for each pixel row during the RS readout operation. Similarly, the "y" in COLy indicates that the depicted signal is associated with readout from a single column (i.e., FIG. 5(F) only illustrates SHR and SHS readout operations for a single column), and that the signal is sequentially generated to read output values from each column using known techniques.

As indicated above FIG. 5(A), the exemplary image capture/readout operation is generally divided into a GS image capture operation and an RS readout operation, where the GS image capture operation is further divided to include a pre-integration phase, an integration phase and a charge transfer phase, and the RS readout operation is generally divided into a charge storage phase and a charge readout phase.

Referring to FIG. 5(A) and to FIG. 4, the global shutter image capture operation begins with the pre-integration phase during which global reset control signal GRST is asserted and simultaneously transmitted to every pixel 110B in array 105 between time T0 and time T1 (all other signals are de-asserted). Referring to FIG. 2, asserting global reset control signal GRST causes global reset transistor Q2 of every pixel in image sensor 100 to turn on, thereby coupling every photodiode P to system voltage VDD such that a charge stored on photodiode P of every pixel 110B, which generates an associated potential at photodiode node PD, is simultaneously reset to an initial photodiode charge (i.e., VDD) at the beginning of the GS image capture operation. All other transistors of pixel group 100 remain off during this period.

Referring to FIG. 5(B) and to FIG. 4, the integration phase begins at time Ti when control circuit 120 causes a first circuit portion (row control circuit 130) to de-assert global reset control signal GRST, which is transmitted to every pixel in array 105, thereby turning off global reset transistor Q2 to isolate photodiode P in every pixel 110B in image sensor 100, whereby photodiode P in each pixel 110B is simultaneously controlled to generate a captured charge in accordance with an amount of light received by that pixel during the integration (first) phase of the global shutter image capture operation. Charge is allowed to accumulate on each photodiode P for a set amount of time (e.g., determined by a user or control circuit 120) which ends at time T2, when transfer gate control signal TX1 is asserted.

Referring to FIG. 5(B) and to Hg. 4, control circuit 120 executes the charge transfer (second) phase of GS image capture by causing a second circuit portion (row control circuit 130) to assert transfer gate control signal TX1 at time T2, and utilizes associated signal lines to simultaneously transmit (first) transfer gate control signal TX1 to (first) transfer gate transistor Q5 in every pixel 110B, thereby simultaneously transferring the charge (image data) captured by each photodiode P during the integration phase to its associated memory node MN in every pixel 110B of array 105. Additional detail regarding how the two-part MN structure facilitates transfer of each captured charge from the photodiode to the memory node diode portion is described below with reference to FIG. 10. The charge transfer phase (and the GS image capture operation) ends at time T3 when transfer gate control signal TX1 is de-asserted to simultaneously turn off transfer gate transistor Q5 in every pixel 110B. In one embodiment, global reset control signal GRST is maintained at a lower potential (e.g., 0.1V to 0.5V lower) than transfer gate control signal TX1 during the period between time T3 and time T4 to stimulate "anti-blooming".

Referring to FIG. 5(A), control circuit 120 starts the charge storage phase of the RS readout operation by causing control circuit 130 to de-assert transfer gate control signal TX1 at time T3, thereby preventing further electron flow from the photodiode to the memory node in each pixel. At time T4 global reset control signal GRS is re-asserted, thereby again depleting charge (electrons) from the photodiode of every pixel. As described in additional detail below with reference to FIG. 11, during the storage phase electrons are prevented from flowing back to photodiode by way of the lower potential profile of the memory node buried layer portion. Note that the charge storage phase for a given pixel continues until the row in which the pixel is selected for readout, and the associated transfer gate control signal TX2x for the pixel's row is asserted in the manner described below.

The control circuit next utilizes a third circuit portion (portions of row control circuit 130 and column control/readout circuit 140) to perform the RS readout operation. According to the preferred embodiment. the RS readout operation involves Correlated Double Sampling (CDS) readout in which a Sample and Hold Reset (SHR) charge level is read out from each pixel of the selected row during a first readout phase, and then a Sample and Hold image (SHS) charge level is read out from each pixel of the selected row, and then the CDS readout process is performed on a next-sequential selected pixel row, Referring to Figs, 5(E), 5(D) and 5(F), the control circuit utilizes portions of row control circuit 130 to generate and transmit SHR control signals (i.e., RSTx and SELx) and SHS control signals (i.e., TX2x and SELx) to each pixel of the selected row such that only the pixels of the selected row receive the SHR and SHS control signals during a corresponding row-select time period, which is determined by the assertion of the row select control signal SELx for the selected row. That is, during the first (SHR) phase, row control circuit 130 asserts row select control signal SELx at time T5 and reset control signals RSTx at time T6, whereby floating diffusion FD of each pixel 110B in the selected row stores a reset charge having a reset (first) voltage level equal to VDD that turns on sample-hold transistor Q3, thereby transmitting the reset level onto an associated column line in response to said SHR control signals. Column control/readout circuit 140 asserts column select signals COLy starting at time T7 to sequentially read the SHR levels from each column line. At time T8, row control circuit 130 de-asserts reset control signals RSTx to end the first (SHR) readout phase. During the second (SHS) phase, row control circuit 130 asserts transfer gate control signal TX2x at time T9, whereby the captured charge stored in memory node MN is transferred to floating diffusion FD in each pixel 110B of the selected pixel, causing these floating diffusions to store image (second) voltage levels determined by the amount of stored charge, whereby sample-hold transistor Q3 is turned on by a corresponding amount proportional to the captured charge, thereby transmitting the captured charge (SHS level) onto an associated column line in response to said SHS control signals. Column control/readout circuit 140 asserts column select signals COLy starting at time TII to sequentially read the SHS levels from each column line.

Referring to FIG. 5(B), according to a feature of array 100 that is made possible by the use of buried channel region MNBC, the (first) transfer gate transistor Q5 of each pixel 110B is controllable using only two voltage levels (i.e., transfer gate control signal TX1 is either VDD or 0V). This is a very attractive feature because it avoids the need for a third "store" control voltage and associated three-level drivers, which are needed in pixel arrangements that require charge storage under the transfer gate, thus simplifying the control circuit and reducing overall costs.

Figure 6:
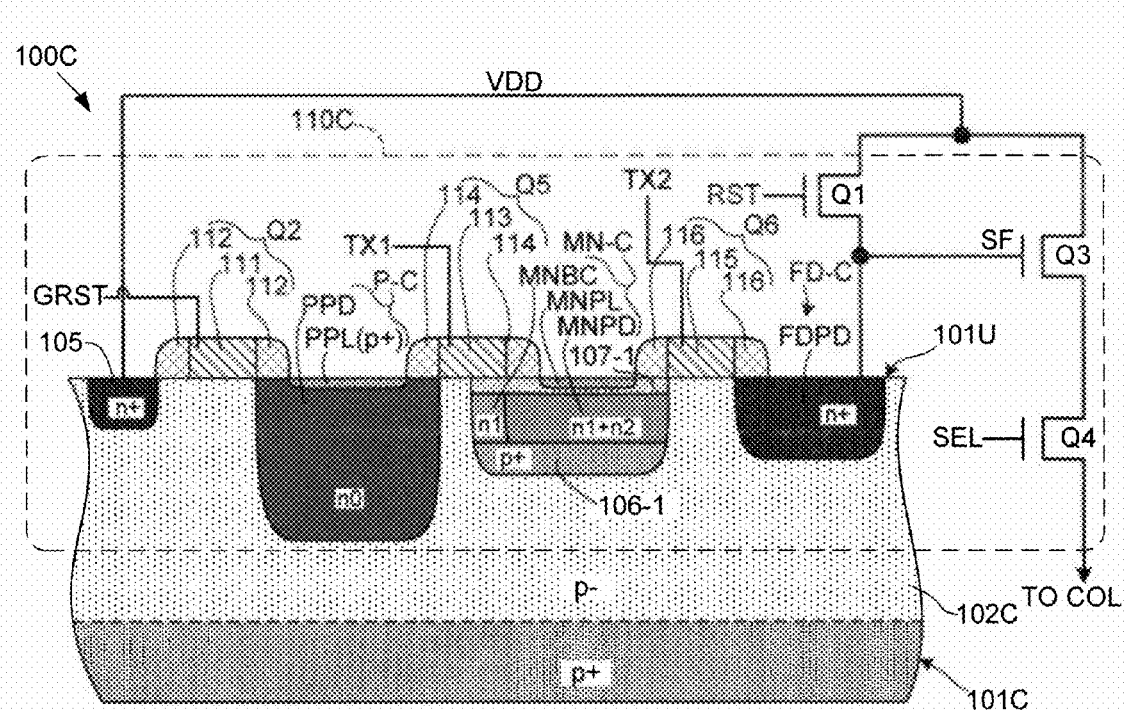
FIG. 6 is a hybrid schematic/cross-sectional diagram showing an exemplary GS pixel of the GS image sensor of FIG. 2 according to another embodiment of the present invention.

FIG. 6 is a hybrid diagram showing a single GS pixel 110C of a GS image sensor 100C according to another embodiment of the present invention. Similar to the embodiments described above, pixel 110C includes a photodiode P-C, a memory node MN-C and a floating diffusion FD-C formed in a p– well region 102C of a p-type substrate 101C, a first transfer gate Q5, and a second transfer gate Q6 disposed on a gate oxide layer (not show) formed on an upper surface 101U of substrate 101C. Photodiode P-C is a pinned diode structure including a diode portion PPD formed by n-type diffusions disposed in a first region of substrate 101C, an a p+ pinning layer PPL formed at upper surface 101U. Memory node MN-C includes a buried channel portion MNBC-C and a diode portion MNPD-C formed by n-type diffusions disposed in a second region of substrate 101C over p-type diffusion 106-1, and under a self-aligned pinning layer MNPD that is formed in a surface boron implant layer 107-1 in the manner described above. Floating diffusion FD-C includes a diode portion FDPD-C formed by n+ diffusion disposed in a third region of substrate 101C. Also shown in FIG. 6 is a global reset transistor Q2 including a polysilicon gate structure 111 and associated sidewall spacers 112, and is operably disposed over a channel (gap) separating an n+ diffusion region 105 connected to system voltage supply VDD and photodiode P-C, and is controlled by global reset control signal GRST. Similar to the previous embodiments, transfer gate Q5 includes polysilicon gate structure 113 and sidewall spacers 114, and is controlled by transfer gate control signal TX1, and transfer gate Q6 includes polysilicon gate structure 115 and sidewall spacers 116, and is controlled by (second) transfer gate control signal TX2. Reset transistor Q1, source-follower transistor Q3 and select transistor Q4 are shown in schematic form for clarity.

FIGS. 7 to 11 include potential diagrams depicting local potentials generated by pixel 110C (shown in FIG. 6), and illustrate additional features and aspects of the present invention according to some embodiments.

Figure 7:
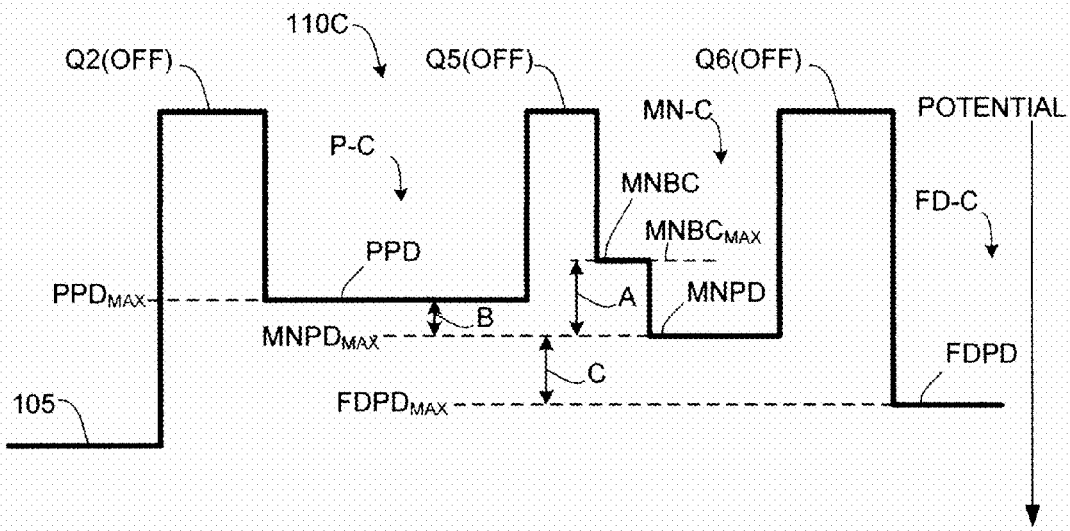
FIGS. 7(A) and 7(B) are potential diagrams showing relative exemplary charges stored on the GS pixel of FIG. 5 when the first transfer transistor is off and when the first transfer transistor is turned on, respectively.

FIG. 7 shows a potential diagram indicating relative potentials of photodiode diode portion PPD, buried channel portion MNBC and memory node diode portion MNPD of memory node MN-C, and floating diffusion diode portion FDPD of floating diffusion FD-C. In FIG. 7, transfer gates Q2, Q6 and Q6 are depicted in a turned off state, whereby transfer gate Q2 generates a potential barrier between the constant high potential well region formed by n+ diffusion region 105 and the relatively small potential photodiode PPD, are turned off according to an embodiment of the present invention. As understood by those in the art, the size and composition of photodiode P-C determines its maximum potential $PPD_{MAX}$, which is indicated in FIG. 7. Similarly, the size and composition of memory node diode portion MNPD and floating diffusion diode portion FDPD determine maximum charge potentials $MNPD_{MAX}$ and $FDPD_{MAX}$, which are also indicated in FIG. 7.

As indicated in FIG. 7 and set forth above, memory node diode portion MNPD has a doping level that is greater than the doping level of buried channel portion MNBC. As such, maximum charge potential $MNPD_{MAX}$ is shown as being greater than a maximum charge potential $MNBC_{MAX}$ of buried channel portion MNBC (i.e., as indicated by arrow A), which generates the intrinsic lateral electrical field discussed above. That is, when transfer gate transistor Q5 is pulsed high (off, e.g., as indicated in FIGS. 7-9 and 11), the lateral field prevents electrons from passing between undoped side of transfer gate transistor Q5 and the doped side of transfer gate transistor Q5. When transfer gate transistor Q5 is pulsed low (on, e.g., as shown in FIG. 10), the lateral field causes electrons to flow from the undoped side of transfer gate transistor Q5 to the pinned MN side.

According to another embodiment of the present invention, diode portion PPD of photodiode P-C, memory node diode portion MNPD of memory node MN-C, and floating diffusion diode portion FDPD of floating diffusion FD-C are fabricated with doping profiles configured to generate relative maximum charge potentials that progressively increase. Specifically, diode portion PPD has a first doping profile configured to generate (first) maximum charge potential $PPD_{MAX}$, and (second) diode portion MNPD of memory node MN-C has a doping profile configured to generate a (second) maximum charge potential $MNPD_{MAX}$ that is slightly greater (e.g., in the range of 0.1V to 0.5V) than maximum charge potential $PPD_{MAX}$, as indicated by arrow B in FIG. 7. Similarly, (third) diode portion FDPD of floating diffusion FD-C has a (third) doping profile configured to generate a (third) maximum charge potential $FDPD_{MAX}$ that is greater than the second maximum charge potential $MNPD_{MAX}$, as indicated by arrow C in FIG. 7. The benefit of this potential well arrangement is fast transfer of electrons in the direction of the FG readout node. Compared with the prior art designs that do not employ the suggested lateral fields, this facilitates the use of decreased operating voltages, and thus suppress parasitic discharge of the MN and FD during the sensor read-out.

FIGS. 8-11 are potential diagrams depicting pixel 110C during various operation phases mentioned above.

Figure 8:
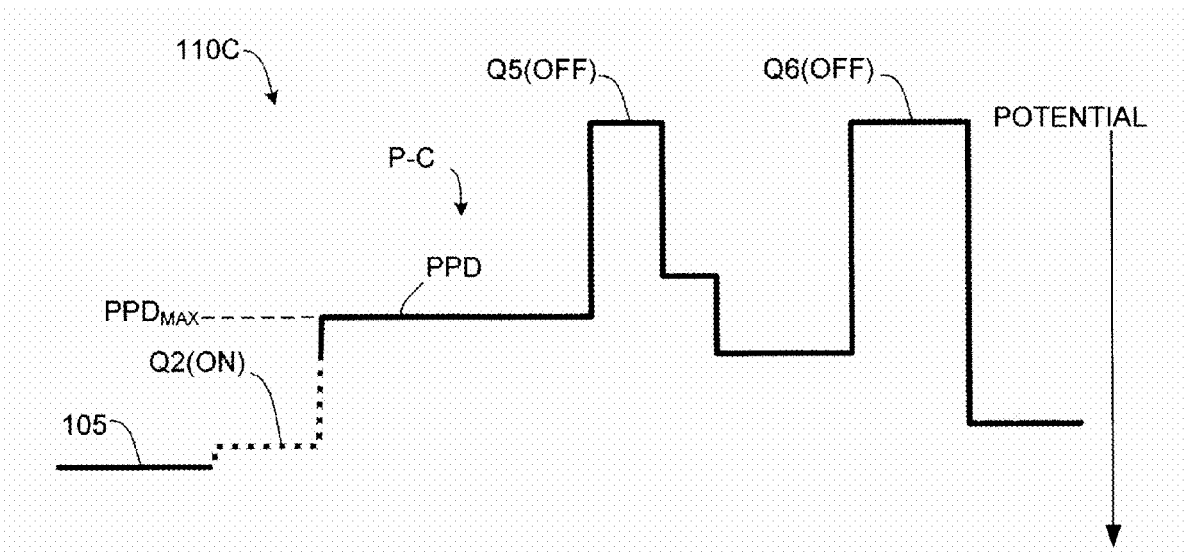
FIG. 8 is a simplified potential diagram showing exemplary pixel charges stored on the GS pixel of FIG. 5 during a global reset operating phase.

FIG. 8 shows the potential diagram of FIG. 7 during a global reset operating phase (i.e., before the start of the integration phase described above). In this state transistor Q2 is turned on by global reset signal GRST (discussed above) such that the potential of transistor Q2 (indicated by the dashed line section in FIG. 8) is increased above maximum potential $PPD_{MAX}$ of diode portion PPD, thereby coupling photodiode P-C to n+ diffusion 105 and thus removing all electrons from photodiode P-C, thereby initializing photodiode P-C to the reset voltage level.

Figure 9:
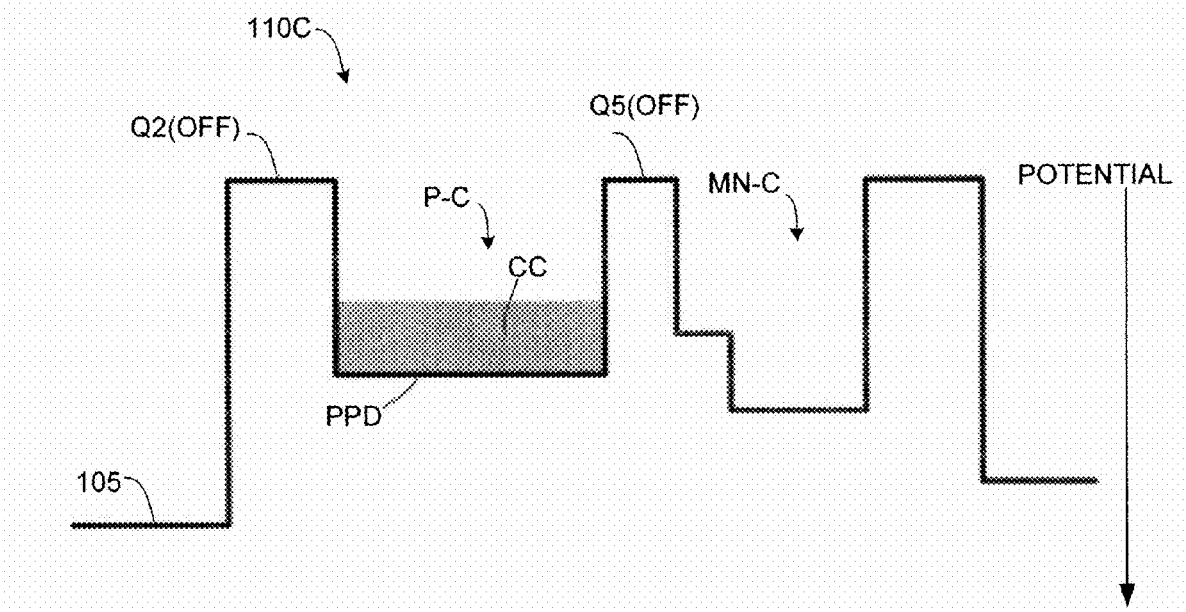
FIG. 9 is a simplified potential diagram showing exemplary pixel charges stored on the GS pixel of FIG. 5 during an integration operating phase.
Figure 10:
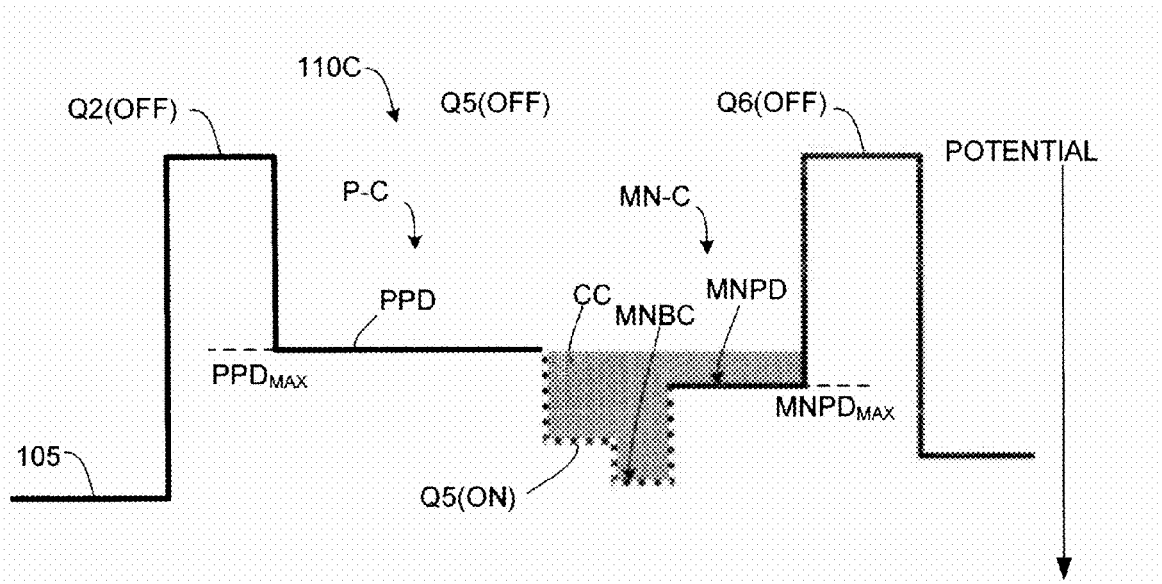
FIG. 10 is a simplified potential diagram showing exemplary pixel charges stored on the GS pixel of FIG. 5 during transfer of a captured charge to the memory node.

FIG. 9 shows the potential diagram of FIG. 7 during the subsequent integration phase, when transistor Q2 is again turned off to re-establish the barrier between photodiode P-C and n+ region 105, and transistor Q5 remains turned off, which maintains the barrier between photodiode P-C and memory node MN-C. As indicated by the shaded block in FIG. 9, with photodiode P-C now decoupled (floating), photoelectrons begin to collect in the potential well formed by diode portion PPD, thereby generating a captured charge CC. As mentioned above, in one embodiment the gate of transistor Q2 is maintained at a lower gate potential than that applied to transfer gate transistor Q5 during this period to stimulate "anti-blooming".

FIG. 10 shows the potential diagram of FIG. 7 during the subsequent charge transfer phase, when transfer gate transistor Q5 is turned on (i.e., transfer gate control signal TX1 discussed above is asserted) such that the potential of transistor Q5 is increased above maximum potential $MNPD_{MAX}$ of diode portion MNPD. Note that turning on transistor Q5 also increases the potential of buried channel portion MNBC above maximum potential $MNPD_{MAX}$ of diode portion MNPD. By removing the barrier between photodiode P-C and memory node MN-C in this manner, the electrons forming captured charge CC are caused to flow from the lower maximum potential $PPD_{MAX}$ of photodiode P-C toward the higher maximum potentials $MNPD_{MAX}$ of memory node diode portion MNPD and the temporarily increased potential of memory node buried channel portion MNBC, whereby the entire captured charge is transferred out of photodiode P-C. Note that electrons cannot spill back to photodiode P-C from memory node buried channel until the potential in buried channel MNBC is again made lower than maximum potential $PPD_{MAX}$.

Figure 11:
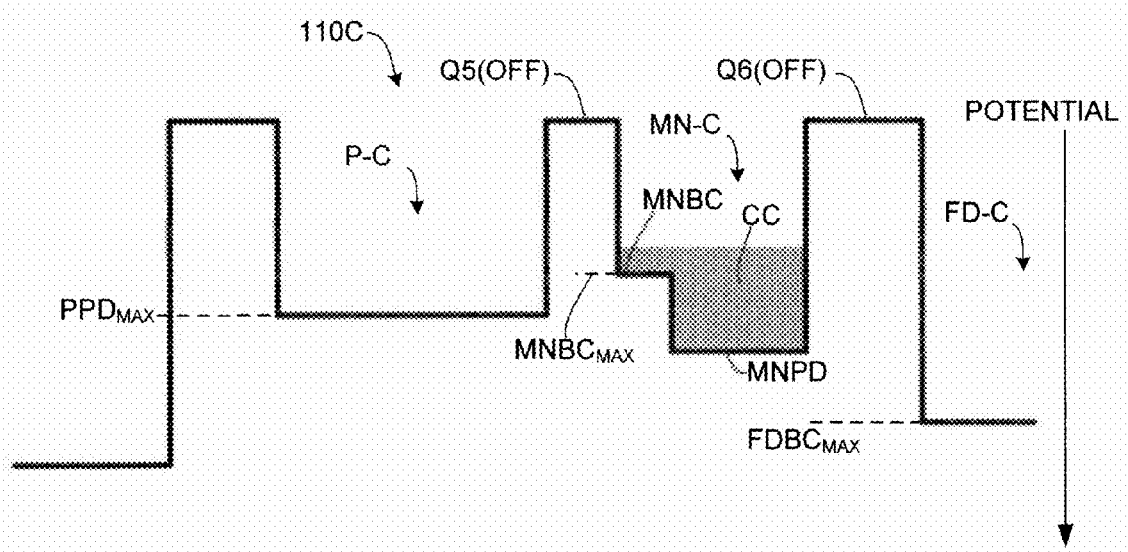
FIG. 11 is a simplified potential diagram showing exemplary pixel charges stored on the GS pixel of FIG. 5 during storage of a captured charge in the memory node.

FIG. 11 shows the potential diagram of FIG. 7 during the subsequent storage phase during which captured charge CC is stored in memory node MN-C. At the end of the charge transfer operation, when substantially all of the electrons are either under transfer gate Q5 (i.e., in memory node buried channel portion MNBC) or in memory node diode portion MNPD, transfer gate Q5 is turned off, which re-establishes the barrier between photodiode P-C and memory node MN-C, and causes the potential of memory node buried channel portion MNBC to return to its initial maximum potential value $MNBC_{MAX}$. When transfer gate Q5 is turned off, substantially all remaining electrons under transfer gate Q5 flows into memory node MN-C due to the intrinsic lateral electrical field. That is, captured charge CC is stored in two physical locations: in buried channel MNBC, which is located below transfer gate transistor Q5, and in diode portion MNPD, which is the pinned diode disposed in the gap between transfer gates Q5 and Q6. The barriers generated by turned-off transistors Q5 and Q6 prevent leakage of captured charge CC from memory node MN-C either into photodiode P-C or floating diffusion FD-C. Note that p-type active area 102A and p-type diffusion 106-1 (FIG. 1(B)) also prevent electron flow from memory node MN-C into photodiode P-C. The methodology for subsequently transferring captured charge CC from memory node MN-C to floating diffusion FD-C is similar to the photodiode P-C to memory node MN-C charge transfer operation described above, and thus is not described in detail.

Figure 12:
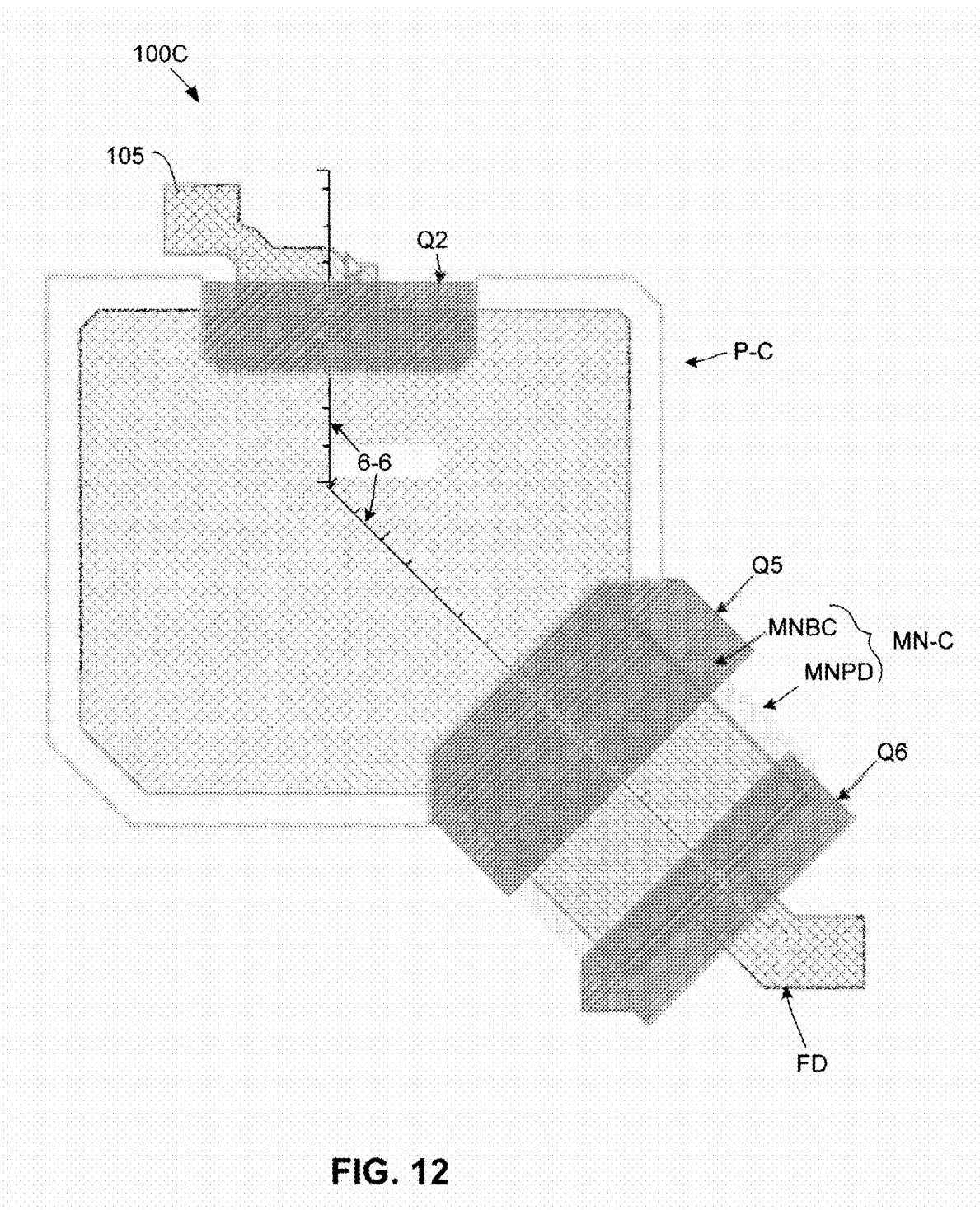
FIG. 12 is a top plan view showing an layout pattern for the GS pixel of FIG. 6 according to an exemplary embodiment of the present invention.

FIG. 12 is a top plan view showing partial GS pixel 110C, which is described above with reference to FIG. 6, according to an exemplary layout pattern. Section line 6-6 in FIG. 12 generally indicates the vertical cut plane used to generate the features shown in FIG. 6. Global reset transistor Q2 is generally indicated by the rectangular polysilicon structure near the top of FIG. 12 that is disposed between diffusion 105 and photodiode P-C. Transfer gate transistor Q5 is generally indicated by the tilted rectangular polysilicon structure near the bottom of photodiode P-C. Memory node MN-C includes buried channel portion MNBC that extends under transfer gate transistor Q5, and diode portion MNPD that is disposed in the gap between transfer gate transistor Q5 and transfer gate transistor Q6, which is indicated by the tilted rectangular polysilicon structure near the bottom of FIG. 12 and disposed between diode portion MNPD and floating diffusion FD-C.

FIGS. 13(A) to 13(G) are cross-sectional side views showing portions of a modified CMOS fabrication process utilized to generate GS pixel 110C according to another embodiment of the present invention. As set forth below, this modified CMOS fabrication process utilizes a single mask pattern twice (i.e., mask 310-1 shown in FIG. 13(A) and mask 310-2 shown in FIG. 13(F)), and utilizes a proprietary deep photodiode process.

Figure 13A:
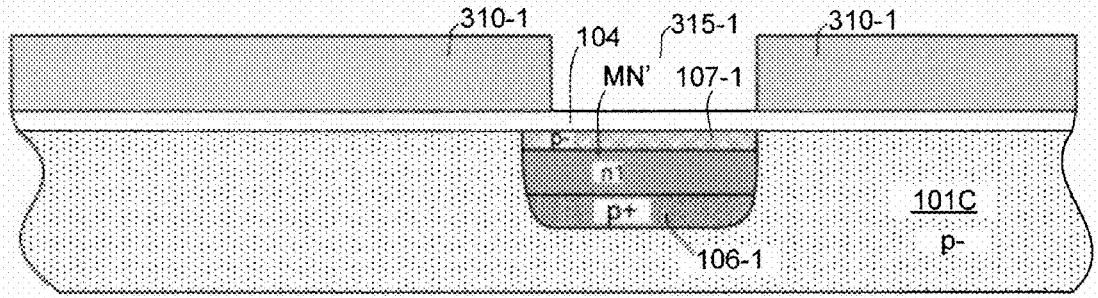
FIGS. 13(A), 13(B), 13(C), 13(D), 13(E), 13(F) and 13(G) are cross-sectional side views showing a fabrication process for generating GS pixels according to another embodiment of the present invention.

FIG. 13(A) shows substrate 101C during the well stage (i.e., before poly deposition) of the fabrication process during which a pad oxide layer 104 is formed on the substrate surface. A first memory node (MN) mask 310-1 is formed by depositing and patterning a first photoresist layer on pad oxide layer 104, and non-self-aligned deep implants are then performed through openings 315-1 using known techniques to generate p-type diffusion 106-1 (i.e., using a p+ dopant), partial memory node implant MN' (using only n-type dopant n1), and surface boron implant 107-1. In an alternative embodiment (not shown), mask 310-1 is modified to facilitate forming a second three-part diffusion that forms floating gate buried channel portion FDBC-A shown in FIG. 1(B).

Figure 13B:
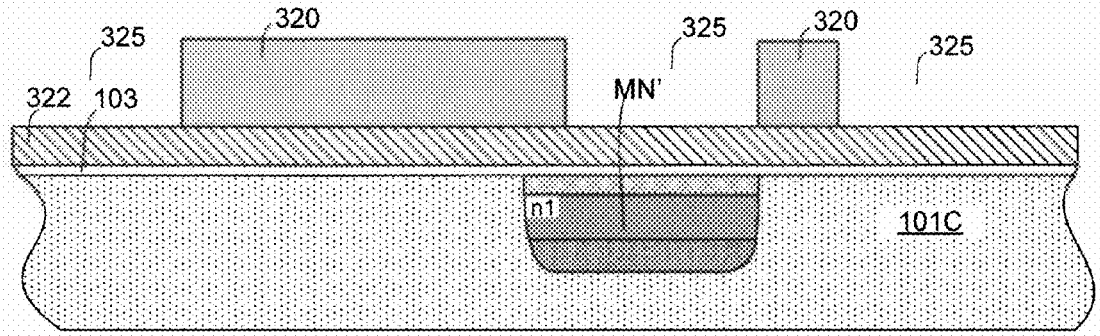
Figure 13C:
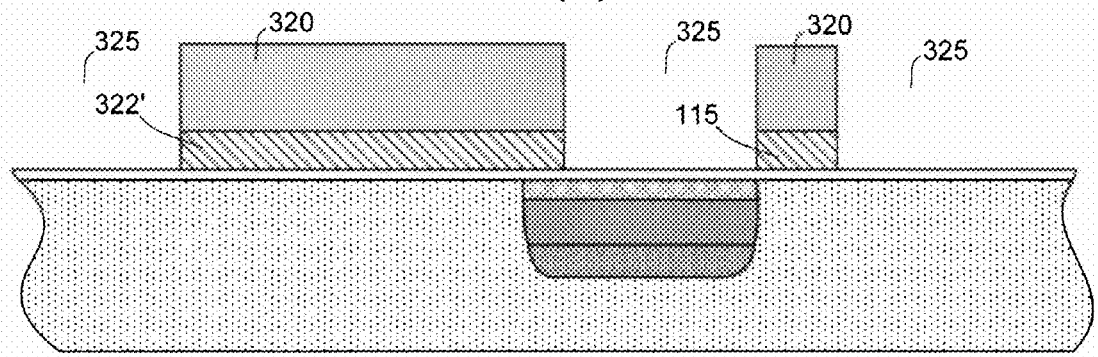
Figure 13D:
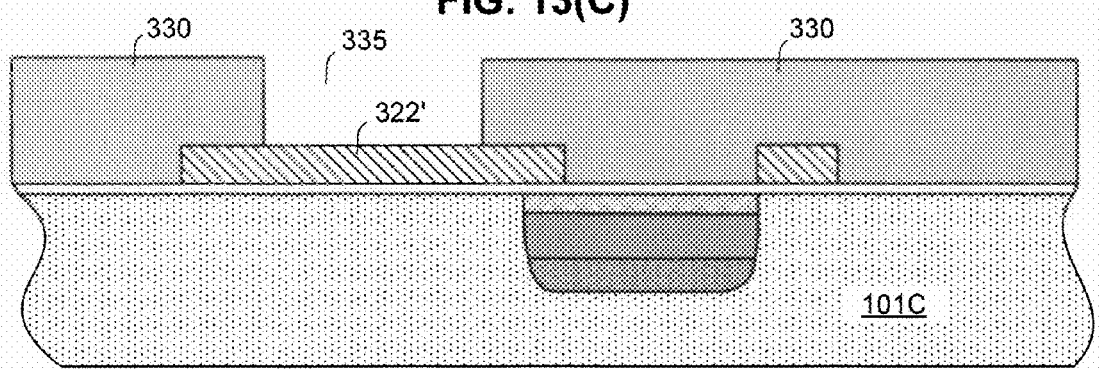
Figure 13E:
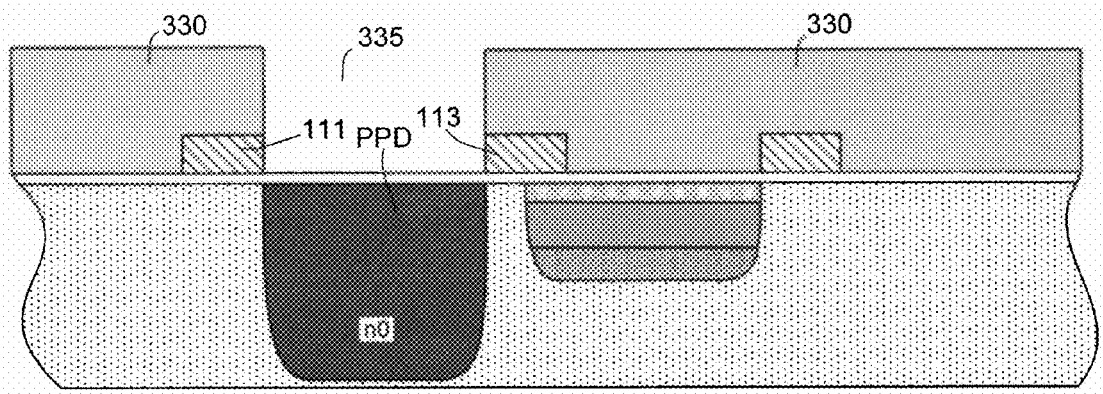

FIGS. 13(B) to 13(E) illustrate formation of the various polysilicon gate structures of the GS pixel using two poly masks. FIG. 13(B) shows substrate 101C after the first MN mask and pad oxide layer have been removed, a gate oxide layer 103 has been formed on the upper substrate surface, a polysilicon layer 322 has been deposited on gate oxide layer 103, and a first poly mask 320 is formed on polysilicon layer 322 by depositing and patterning a second photoresist layer on gate oxide layer 103. As indicated in FIGS. 13(B) and 13(C) a first poly etch is then performed through openings 325 defined in first poly mask 320 to form polysilicon gate structure 115 (which is part of second transfer gate transistor Q6, discussed above) and an intermediate polysilicon structure 322'. FIG. 13(D) shows substrate 101C after the first poly mask has been removed, and a second poly mask 330 is formed and patterned by depositing and patterning a second photoresist layer such that an opening 335 exposes a central portion of intermediate polysilicon structure 322'. FIG. 13(E) shows substrate 101C after a second poly etch is performed through opening 335 to form polysilicon gate structures 111 and 113 (which are associated with global reset transistor Q2 and first transfer gate transistor Q5, discussed above).

As indicated in FIG. 13(E), after poly patterning, second poly mask 330 is then utilized to perform a deep photodiode process to form diode portion PPD such that it is self-aligned to polysilicon gate structures 111 and 113. This deep diode implant is performed using the proprietary process described, for example, in co-owned U.S. Pat. No. 7,749,874 "Deep implant self-aligned to polysilicon gate" (Drowley et al, 2010), which is incorporated herein by reference in its entirety.

Figure 13F:
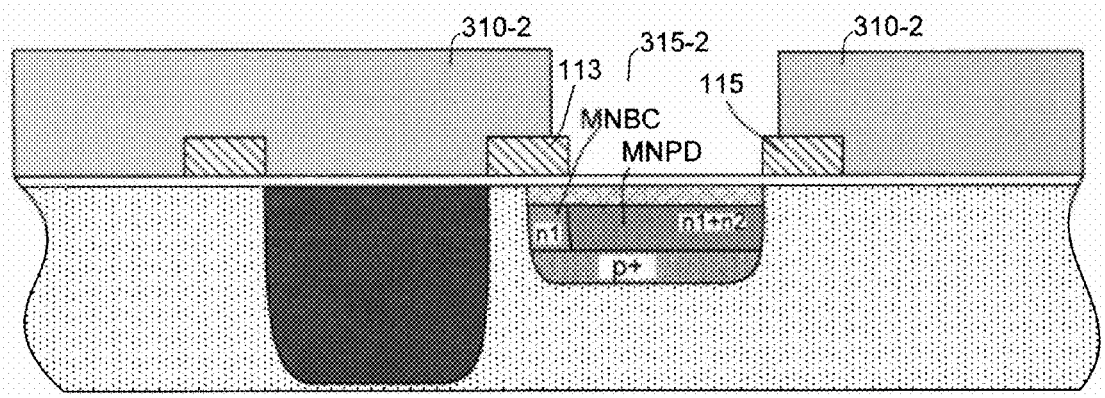
Figure 13G:
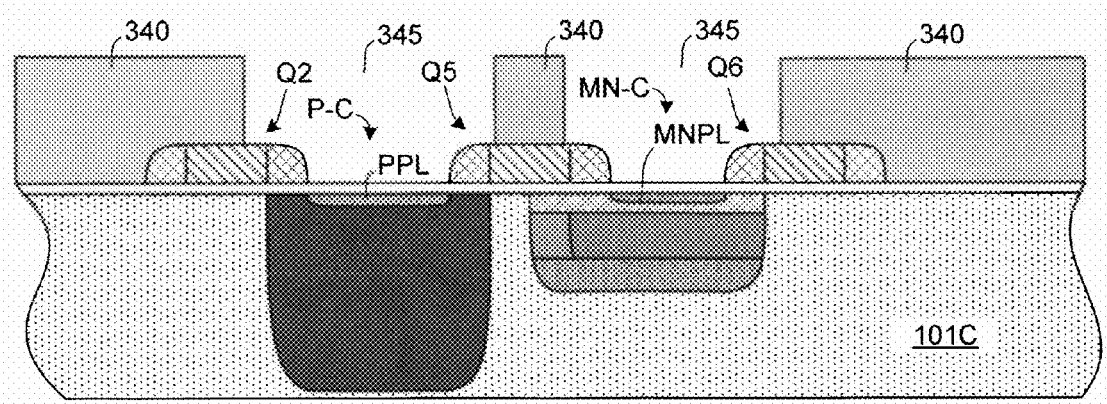

FIG. 13(F) shows substrate 101C after the second poly mask has been removed, and a second MN mask 310-2 is formed over the substrate surface. Second MN mask 310-2 is formed by exposing a photoresist layer using the same reticle as that utilized to form first MN mask 310-1 (described above with reference to FIG. 13(A)). After forming second MN mask 310-2, another n-type implant is performed using known techniques to form memory node diode portion MNPD by implanting n-type dopant n2 through opening 315-2, thereby fixing the maximum potential of diode portion MNPD to higher potential than that of buried channel portion MNBC. Note that formation of diode portion MNPD involves implanting the n2 dopant such that it is self-aligned to polysilicon gate structures 113 and 115, which improves significantly the immunity to process variation, and that the n2 implant is performed such that polysilicon gate structure 113 prevents implanting the n2 dopant into buried channel portion MNBC.

FIG. 13(F) shows substrate 101C after the second MN mask has been removed and addition processing has been performed to, e.g., form sidewall spacers that complete the gate structures for transistors Q2, Q5 and Q6. An additional mask 340 is then formed by depositing and patterning a resist layer that defines openings 345 exposing the gap region between transistors Q2 and Q5 and the gap region between transistor Q5 and Q6. Mask 340 is used for generating p+ pinning layers PPL and MNPL that complete the fabrication of pinned photodiode P-C and pinned memory node MN-C. Note that pinning layers PPL and MNPL are self-aligned to the poly spacers of transistors Q2, Q5 and Q6, which again improves the immunity to process variation. Compared with the prior art, the proposed process does not include fabricating a shallow p-shield under transfer gate transistor Q5, which would introduce an additional barrier for electrons and would require an additional mask.

Figure 14:
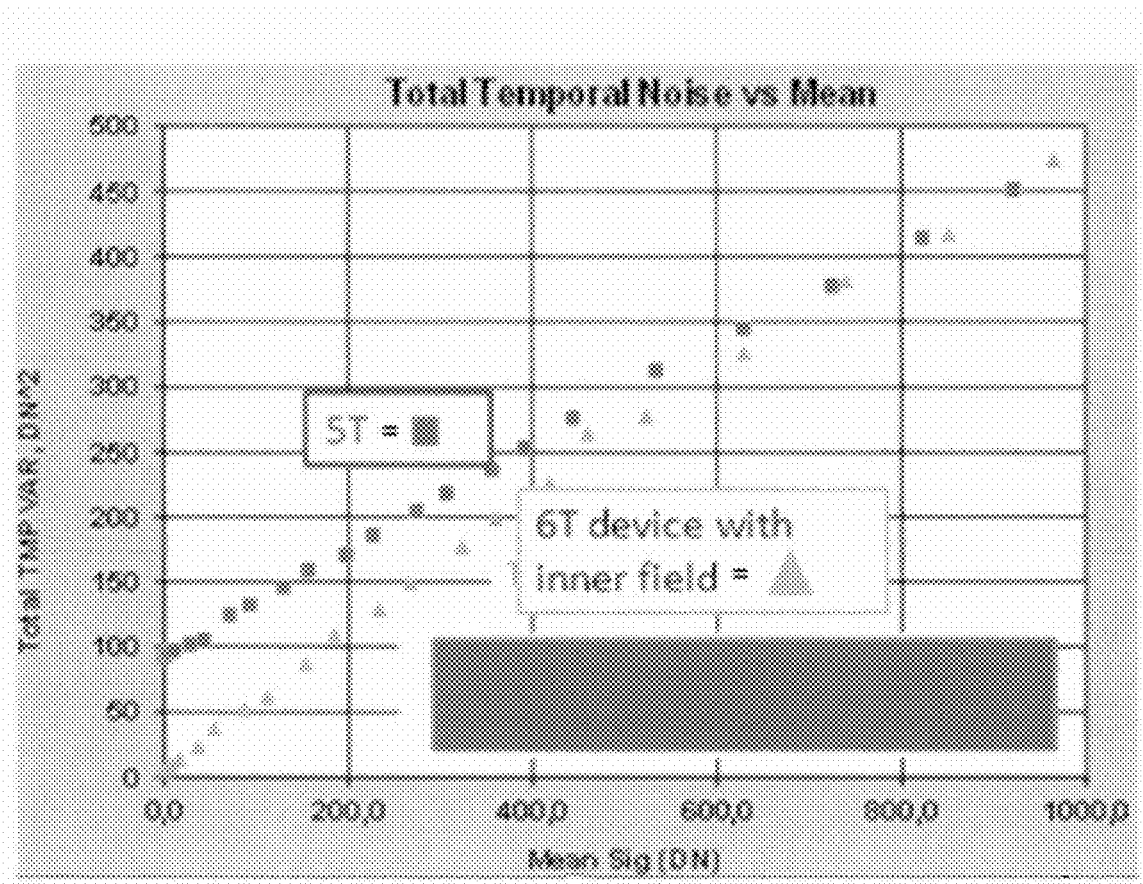
FIG. 14 is a graph comparing data taken from a 6T device formed in accordance with the present invention with data from a conventional 5T device.

FIG. 14 is a graph showing data measured from a 6T device formed in accordance with the present invention, and data taken from a conventional 5T device having the same pixel pitch (i.e., 3.6 μm) as the 6T device. The measurement data shows clearly noise reduction of about a factor of five from 10 DN (~25e) to less than 5e. Most of the temporal noise that exists in the 6T chip comes from the chip peripheral circuit and not the pixel (for the 5T device it is opposite situation).

Although the present invention has been described with respect to certain specific embodiments, it will be clear to those skilled in the art that the inventive features of the present invention are applicable to other embodiments as well, all of which are intended to fall within the scope of the present invention. For example, although the present invention is described with reference to 6T GS CMOS image sensors, the various features and aspects of the present invention may be beneficially utilized in other types of image sensors, or in GS CMOS image sensors having pixels including a different number (e.g., more than six) transistors. In addition, although the present invention is described with reference to formation of the circuit in a p-type substrate, the n-type diffusions forming the various diode structures may be formed using p-type diffusions formed in an n-type substrate.

The invention claimed is:

1. An image sensor including a plurality of pixels disposed on a substrate, wherein each pixel comprises:
a photodiode disposed in a first region of the substrate;
a memory node disposed in a second region of the substrate, the second region being spaced from the first region;
a first transfer gate connected between the memory node and the photodiode;
a floating diffusion disposed in a third region of the substrate, the third region being spaced from the first and second regions; and
a second transfer gate connected between the memory node and the floating diffusion,
wherein the memory node includes a first buried channel portion disposed under the first transfer gate and having a first doping level, and a first diode portion and having a second doping level that is greater than the first doping level such that an intrinsic lateral electrical field is generated that drives electrons from the first buried channel portion into the first diode portion, and
wherein the floating diffusion of each said pixel further comprises a second buried channel portion disposed under the second transfer gate and having a third doping level, and a second diode portion having a fourth doping level that is greater than the third doping level such that a second intrinsic lateral electrical field is generated that drives electrons from the second buried channel portion into the second diode portion.

2. The image sensor of claim 1,
wherein the first buried channel portion and the first diode portion comprise n-type dopants, and
wherein each pixel further comprises:
a first p-type diffusion disposed under the first buried channel portion and the first diode portion of the memory node, and
a second p-type diffusion disposed between the first buried channel portion and the first diode portion of the memory node and an upper surface of the substrate.

3. The image sensor of claim 2,
wherein the first and second buried channel portions comprise a first n-type dopant such that the first doping level is equal to the third doping level,
wherein the first of the memory node comprises a combination of the first n-type dopant and a second n-type dopant, and
wherein the floating diffusion comprises a third n-type dopant configured such that the fourth doping level is greater than the second doping level.

4. The image sensor of claim 2, wherein each pixel further comprises a light shield disposed over the floating diffusion, the second transfer gate, the memory node, and at least a portion of the first transfer gate.

5. The image sensor according to claim 2,
wherein the image sensor comprises a global shutter image sensor, and
wherein each said pixel further comprises:
a reset transistor connected between a voltage source and said floating diffusion and having a gate terminal operably coupled to receive a reset control signal;
a global reset transistor connected between said voltage source and said photodiode and having a gate terminal operably coupled to receive a global reset signal;
a source-follower transistor having a gate terminal connected to said floating diffusion; and
a row-select transistor connected between said source-follower transistor and a readout signal line, a gate terminal of said row-select transistor being connected to receive a row select control signal.

6. The image sensor according to claim 5,
wherein the plurality of pixels are disposed in an array including a plurality of rows and a plurality of columns, and
wherein the global shutter image sensor further comprises a control circuit including:
a first circuit portion configured to transmit a global reset control signal to the global reset transistor in all of the plurality of pixels such that a charge stored on the photodiode of all of the pixels of the pixel array is simultaneously reset to an initial photodiode charge at the beginning of a global shutter image capture operation, and such that the photodiode of each said pixel is controlled to generate a captured charge in accordance with an amount of light received by said each pixel during a first phase of the global shutter image capture operation;
a second circuit portion configured to transmit a first transfer gate control signal to the first transfer gate transistor in all of the plurality of pixels such that, in each said pixel, said captured charge is transferred from said photodiode to said memory node during a second phase of the global shutter image capture operation;
a third circuit portion configured to transmit sample-and-hold reset (SHR) control signals and sample-and-hold (SHS) control signals to said plurality pixels and to read out image data from said plurality of pixels during a rolling shutter readout operation such that only the pixels of a selected row of pixels receive said SHR control signals and said SHS control signals during a corresponding row-select time period of said rolling shutter readout operation,
wherein the third circuit portion is configured such that each said pixel of said selected row is controlled such that said floating diffusion of each said pixel stores a reset charge having a first voltage level, and said first voltage level is transmitted onto an associated column line in response to said SHR control signals during a first phase of said corresponding row-select time period, and
wherein the third circuit portion is configured such that each said pixel of said selected row is controlled such that said captured charge is transferred from said memory node to said floating diffusion of each said pixel, and a second voltage level generated by said captured charge is transmitted onto said associated column line in response to said SHS control signals during a second phase of said corresponding row-select time period.

7. The image sensor according to claim 6,
wherein the photodiode and the first diode portion of the memory node comprise pinned diode structures, and
wherein the second circuit portion is further configured such that said first transfer gate control signal transmitted to the first transfer gate transistor in all of the plurality of pixels has only two voltage levels.

8. The image sensor according to claim 5,
wherein the photodiode of each said pixel comprises a diode portion having a first doping profile configured to generate a first maximum charge potential, and
wherein said first diode portion has a second doping profile configured to generate a second maximum charge potential that is greater than the first maximum charge potential.

9. The image sensor according to claim 8, wherein said floating diffusion of each said pixel comprises a third diode portion having a third doping profile configured to generate a third maximum charge potential that is greater than the second maximum charge potential.

10. A global shutter image sensor including a plurality of pixels disposed on a substrate, wherein each pixel comprises:
a photodiode disposed in a first region of the substrate;
a memory node disposed in a second region of the substrate, the second region being spaced from the first region;
a floating diffusion disposed in a third region of the substrate, the third region being spaced from the first and second regions;
a first transfer gate connected between the memory node and the photodiode; and
a second transfer gate connected between the memory node and the floating diffusion,
wherein the memory node includes a first buried channel portion disposed under the first transfer gate and having a first doping level, and a first diode portion and having a second doping level that is greater than the first doping level,
wherein the first diode portion of the memory node is configured to have a first maximum potential value, and
wherein the floating diffusion includes a second diode portion configured to a second maximum potential value,
wherein the photodiode includes a third diode portion configured to a first maximum potential value, and
wherein the first, second and third diode portions are configured such that the second maximum potential value is greater than the first maximum potential value, and such that the first maximum potential value is greater than the third maximum potential value.

11. The global shutter image sensor of claim 10, wherein the first buried channel portion of the memory node is configured to have a fourth maximum potential value that is lower than the first maximum potential value of the first diode portion.

12. A global shutter image sensor including a plurality of pixels disposed on a substrate, wherein each pixel comprises:
a photodiode disposed in a first region of the substrate;
a memory node disposed in a second region of the substrate, the second region being spaced from the first region;
a floating diffusion disposed in a third region of the substrate, the third region being spaced from the first and second regions;
a first transfer gate connected between the memory node and the photodiode; and
a second transfer gate connected between the memory node and the floating diffusion,
wherein the memory node includes a first buried channel portion disposed under the first transfer gate and having a first doping level, and a first diode portion and having a second doping level that is greater than the first doping level, and
wherein the floating diffusion of each said pixel further comprises a second buried channel portion disposed under the second transfer gate and having a third doping level, and a second diode portion having a fourth doping level that is greater than the third doping level.

13. The global shutter image sensor of claim 12,
wherein the photodiode and the first diode portion of the memory node comprise pinned diode structures, wherein the first buried channel portion and the first diode portion comprise n-type dopants, and wherein each pixel further comprises:
a first p-type diffusion disposed under the first buried channel portion and the first diode portion of the memory node, and
a second p-type diffusion disposed between the first buried channel portion and the first diode portion of the memory node and an upper surface of the substrate.

14. The global shutter image sensor of claim 12, wherein each pixel further comprises a light shield disposed over the floating diffusion, the second transfer gate, the memory node, and at least a portion of the first transfer gate.

15. The global shutter image sensor according to claim 12, wherein each said pixel further comprises:
a reset transistor connected between a voltage source and said floating diffusion and having a gate terminal operably coupled to receive a reset control signal;
a global reset transistor connected between said voltage source and said photodiode and having a gate terminal operably coupled to receive a global reset signal;
a source-follower transistor having a gate terminal connected to said floating diffusion; and
a row-select transistor connected between said source-follower transistor and a readout signal line, a gate terminal of said row-select transistor being connected to receive a row select control signal.

16. The global shutter image sensor according to claim 15, wherein the plurality of pixels are disposed in an array including a plurality of rows and a plurality of columns, and
wherein the global shutter image sensor further comprises a control circuit including:
a first circuit portion configured to transmit a global reset control signal to the global reset transistor in all of the plurality of pixels such that a charge stored on the photodiode of all of the pixels of the pixel array is simultaneously reset to an initial photodiode charge at the beginning of a global shutter image capture operation, and such that the photodiode of each said pixel is controlled to generate a captured charge in accordance with an amount of light received by said each pixel during a first phase of the global shutter image capture operation;
a second circuit portion configured to transmit a first transfer gate control signal to the first transfer gate transistor in all of the plurality of pixels such that, in each said pixel, said captured charge is transferred from said photodiode to said memory node during a second phase of the global shutter image capture operation;
a third circuit portion configured to transmit sample-and-hold reset (SHR) control signals and sample-and-hold (SHS) control signals to said plurality pixels and to read out image data from said plurality of pixels during a rolling shutter readout operation such that only the pixels of a selected row of pixels receive said SHR control signals and said SHS control signals during a corresponding row-select time period of said rolling shutter readout operation,
wherein the third circuit portion is configured such that each said pixel of said selected row is controlled such that said floating diffusion of each said pixel stores a reset charge having a first voltage level, and said first voltage level is transmitted onto an associated column line in response to said SHR control signals during a first phase of said corresponding row-select time period, and
wherein the third circuit portion is configured such that each said pixel of said selected row is controlled such that said captured charge is transferred from said memory node to said floating diffusion of each said pixel, and a second voltage level generated by said captured charge is transmitted onto said associated column line in response to said SHS control signals during a second phase of said corresponding row-select time period.

17. The global shutter image sensor according to claim 16, wherein the photodiode comprises a pinned diode structure, and
wherein the second circuit portion is further configured such that said first transfer gate control signal transmitted to the first transfer gate transistor in all of the plurality of pixels has only two voltage levels.

18. A global shutter image sensor including a plurality of pixels disposed on a substrate, wherein each pixel comprises:
a first transistor configured to couple a first node to a voltage source in response to a reset control signal;
a photodiode configured to generate a captured charge in accordance with an amount of light received by said each pixel during a first time period;
a second transistor configured to couple the photodiode to the voltage source in response to a global reset control signal;
a third transistor coupled between the voltage source and a second node and having a gate terminal connected to the first node;
a fourth transistor configured to couple the second node to an output line in response to a row-select control signal;
a memory node including a first diode portion configured to store said captured charge during a second time period;
a first transfer gate configured to transfer the captured charge from the photodiode to the memory node in response to a first transfer gate control signal;
a floating diffusion including a second diode portion configured to store said captured charge during a third time period; and
a second transfer gate configured to transfer the captured charge from the memory node to the floating diffusion in response to a second transfer gate control signal,
wherein the memory node includes a first buried channel portion disposed under the first transfer gate and having a first doping level, and
wherein said first diode portion of said memory node is contiguous with said first buried channel portion, is disposed in a gap region between the first transfer gate and the second transfer gate, and has a second doping level that is greater than the first doping level such that the memory node includes an intrinsic lateral electrical field that drives electrons from the first buried channel portion into the first diode portion, and
wherein the floating diffusion of each said pixel further comprises a second buried channel portion disposed under the second transfer gate and having a third doping level, and a third diode portion having a fourth doping level that is greater than the third doping level.

* * * * *